United States Patent
Jiang et al.

(10) Patent No.: US 12,096,624 B2
(45) Date of Patent: Sep. 17, 2024

(54) SEMICONDUCTOR MEMORY DEVICE AND METHOD FOR MAKING THE SAME

(71) Applicant: Taiwan Semiconductor Manufacturing Company, Ltd., Hsinchu (TW)

(72) Inventors: Yu-Wei Jiang, Hsinchu (TW); Sheng-Chih Lai, Hsinchu (TW); Chung-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 545 days.

(21) Appl. No.: 17/332,010

(22) Filed: May 27, 2021

(65) Prior Publication Data

US 2022/0384470 A1 Dec. 1, 2022

(51) Int. Cl.
*H10B 41/27* (2023.01)
*H10B 41/10* (2023.01)
*H10B 43/10* (2023.01)
*H10B 43/27* (2023.01)
*H10B 51/10* (2023.01)
*H10B 51/20* (2023.01)

(52) U.S. Cl.
CPC ............ *H10B 41/27* (2023.02); *H10B 41/10* (2023.02); *H10B 43/10* (2023.02); *H10B 43/27* (2023.02); *H10B 51/10* (2023.02); *H10B 51/20* (2023.02)

(58) Field of Classification Search
CPC ........ H10B 41/10; H10B 41/27; H10B 43/10; H10B 43/20; H10B 43/27; H10B 51/10; H10B 51/20
See application file for complete search history.

(56) References Cited

U.S. PATENT DOCUMENTS

| | | | |
|---|---|---|---|
| 2020/0185411 A1* | 6/2020 | Herner | H01L 21/31144 |
| 2020/0381450 A1* | 12/2020 | Lue | H10B 43/27 |
| 2021/0074726 A1* | 3/2021 | Lue | H10B 51/30 |
| 2022/0130862 A1* | 4/2022 | Lue | H10B 51/20 |

* cited by examiner

*Primary Examiner* — Meiya Li
(74) *Attorney, Agent, or Firm* — Birch, Stewart, Kolasch & Birch, LLP

(57) ABSTRACT

A semiconductor memory device includes a substrate, a stack structure disposed on the substrate, a plurality of dielectric isolation segments extending through the stack structure, and a plurality of memory cell structures. The stack structure includes a plurality of dielectric layers and a plurality of conductive layers alternatingly stacked in a Z direction substantially perpendicular to the substrate. The memory cell structures are disposed in the stack structure, and are separated from one another by the dielectric isolation segments. Each of the memory cell structures includes a pair of conductive segments each penetrating the stack structure in the Z direction, a dielectric separation segment separating the conductive segments, a conductive channel segment enclosing side surfaces of the conductive segments and the dielectric separation segment, and a memory segment enclosing side surface of the conductive channel segment and being connected between the stack structure and the conductive segment.

20 Claims, 44 Drawing Sheets

SEMICONDUCTOR MEMORY DEVICE AND METHOD FOR MAKING THE SAME

BACKGROUND

Currently, memory devices are widely used in various fields, such as cloud storage, medicine, transportation, mobile devices, etc. In order to provide memory devices with smaller dimension and higher storage capacity, manufacturers of memory devices have now shifted their focus on the development and production of 3-dimensional (3D) memory devices, where Dynamic random-access memory (DRAM) devices and 3D NAND flash memory devices are two common types of commercial memories. DRAM has a rapid operation speed, and 3D NAND possesses large storage capacity. It is desirable to develop a memory device, such as a NOR flash memory device, which has balanced properties between DRAM and 3D NAND. 3D NOR-type memory architectures provide multiple cells connected in parallel, and have promising potential to achieve high storage capacity and high bandwidth while maintaining fast operation speed, which enables specialized applications, such as sum-of-product operation that can be used in artificial intelligence (AI) applications or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
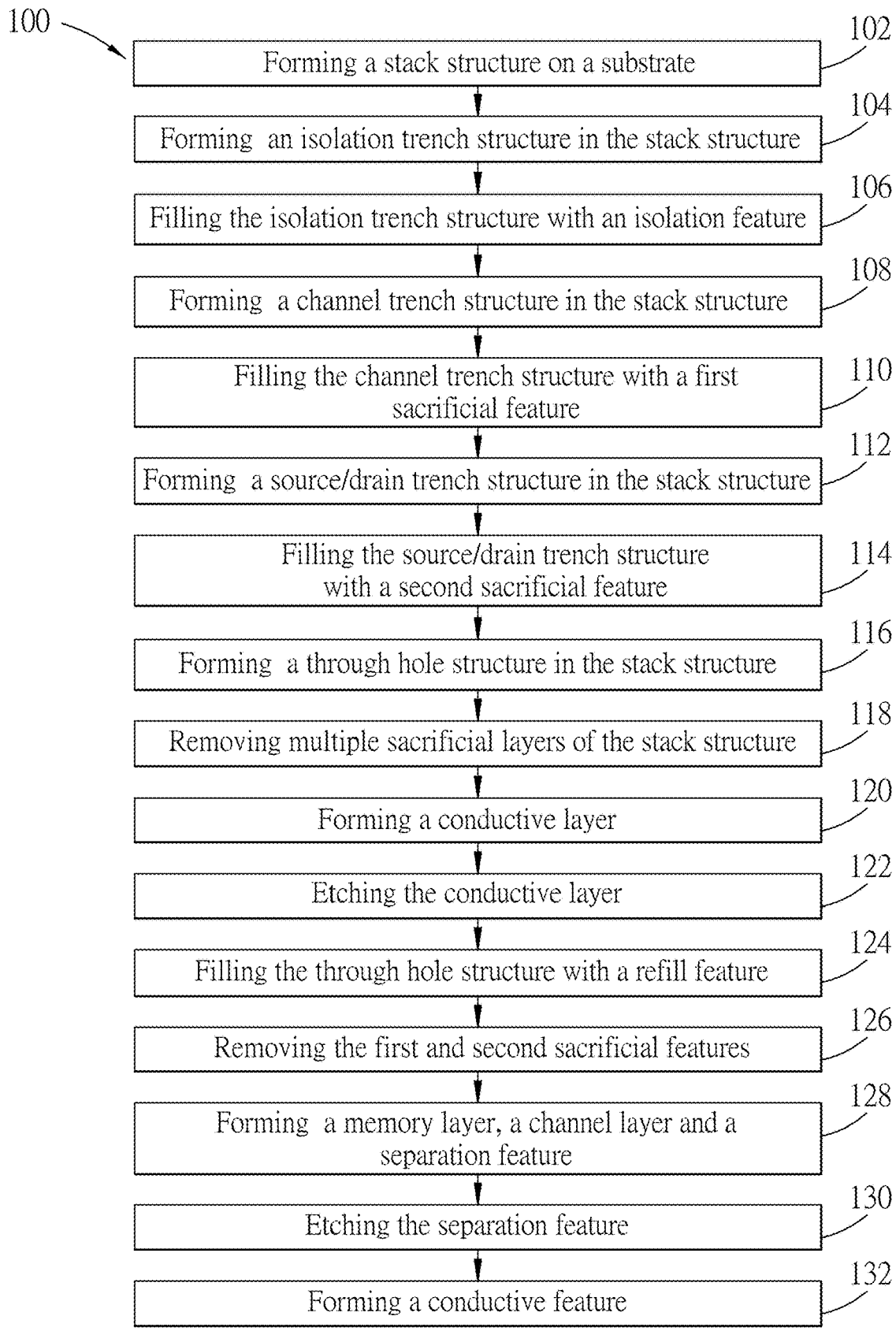
FIG. 1 is a flow chart illustrating a method for manufacturing a semiconductor memory device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
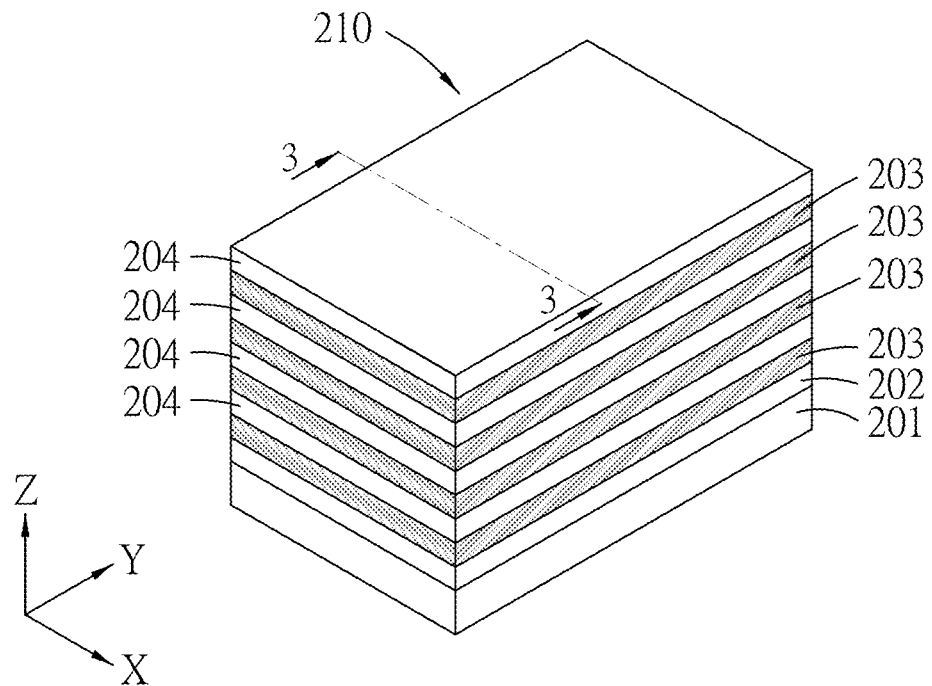
FIGS. 2 to 65 illustrate intermediate stages of the method as depicted in FIG. 1.
Figure 61:
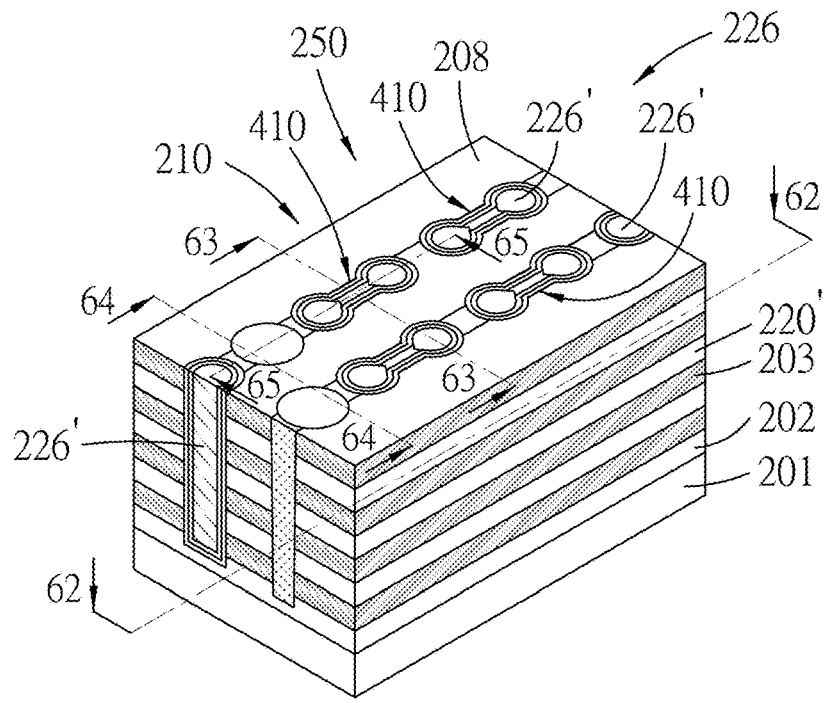

FIG. 1 illustrates a method 100 for manufacturing a semiconductor memory device 250 (see FIG. 61) in accordance with some embodiments. FIGS. 2 to 61 are schematic views showing intermediate stages of the method 100 as depicted in FIG. 1. Additional steps which are not limited to those described in the method 100, can be provided before, after or during manufacturing of the semiconductor memory device 250, and some of the steps described herein may be replaced by other steps or be eliminated. Similarly, additional features may be present in the semiconductor memory device 250, and/or features present may be replaced or eliminated in additional embodiments.

Figure 3:
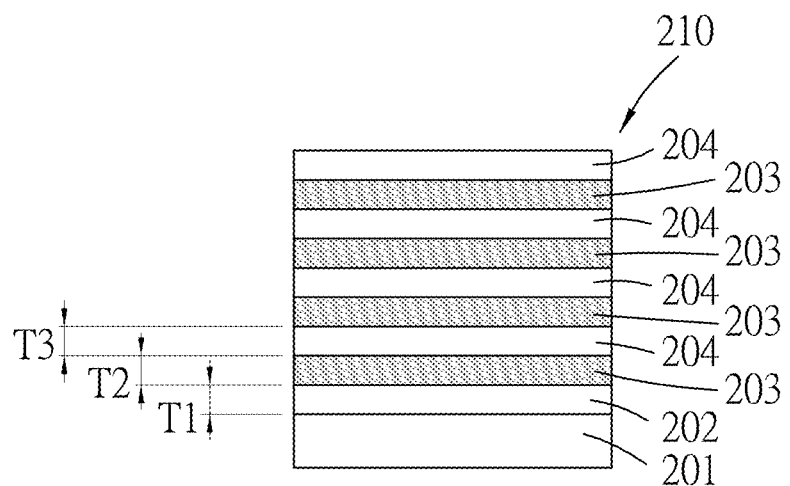

Referring to FIG. 1, the method 100 begins at block 102, where a stack structure is formed on a substrate. Referring to the example illustrated in FIG. 2, the stack structure 210 is formed on the substrate 201. FIG. 3 is a schematic sectional view taken from line 3-3 of FIG. 2. In some embodiments, the semiconductor substrate 201 may be a suitable substrate, such as an elemental semiconductor or a compound semiconductor. The elemental semiconductor may contain a single species of atom, such as Si, Ge or other suitable materials, e.g., other elements from column 14 of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, or the like. In some embodiments, the composition of the compound semiconductor including the aforesaid elements may change from one ratio at one location to another ratio at another different location (i.e., the compound semiconductor may have a gradient composition). In some embodiments, the semiconductor substrate 201 may be a semiconductor-on-insulator (SOI) substrate, such as silicon germanium-on-insulator (SGOI) substrate, or the like. In some embodiments, an SOI substrate may include an epitaxially grown semiconductor layer, such as Si, Ge, SiGe, any combination thereof, or the like, which is formed over an oxide layer.

In some embodiments, the stack structure 210 includes an etch stop layer 202 formed on the substrate 201. In some embodiments, the etch stop layer 202 may be made of a suitable dielectric material, such as silicon oxide ($SiO_x$), SiCN, SiOC, any combination thereof, or the like, and may have a thickness (T1) ranging from about 20 nm to about 200 nm, but other range values are also within the scope of this disclosure. In some embodiments, the etch stop layer 202 may be made by a suitable technique, such as chemical vapor deposition (CVD), atomic layer deposition (ALD), physical vapor deposition (PVD), any combination thereof, or the like. In some embodiments, the stack structure 210 further includes a plurality of dielectric layers 203 and a plurality of sacrificial layers 204 that are alternatingly stacked on the substrate 201 and the etch stop layer 202, for example, in a Z direction (see FIG. 2) which may be substantially perpendicular to the substrate 201. In this embodiment, one of the dielectric layers 203 is first formed on the etch stop layer 202, followed by forming one of the sacrificial layers 204 on such dielectric layer 203. However, in other embodiments, one of the sacrificial layers 204 may be first formed on the etch stop layer 202, followed by forming one of the dielectric layers 203 on such sacrificial layers 204. In this embodiment, a top layer of the stack structure 210 is exemplified to be one of the sacrificial layers 204. However, in other embodiments, the top layer of the stack structure 210 may be one of the dielectric layers 203. In some embodiments, the total number of the dielectric layers 203 and the sacrificial layers 204 may range from 5 to 200, but other range values are also within the scope of this disclosure.

Each of the dielectric layers 203 may be made of a suitable dielectric material, such as SiOx, SiCN, SiOC, any combination thereof, or the like, and may have a thickness (T2) ranging from about 20 nm to about 200 nm, but other range values are also within the scope of this disclosure. In some embodiments, the dielectric layers 203 may be made by a suitable technique, such as CVD, ALD, PVD, any combination thereof, or the like. Each of the sacrificial layers 204 may be made of a suitable material, such as $Si_3N_4$, amorphous silicon, a combination thereof, or the like, and may have a thickness (T3) ranging from about 20 nm to about 200 nm, but other range values are also within the scope of this disclosure. In some embodiments, the sacrificial layers 204 may be made by a suitable technique, such as CVD, ALD, PVD, any combination thereof, or the like. In some embodiments, the sacrificial layers 204 are made of a material that has a high etch selectivity relative to the etch stop layer 202 and the dielectric layers 203 (i.e., a suitable etchant may readily etch the sacrificial layers 204 while leaving the etch stop layer 202 and the dielectric layers 203 substantially unetched).

Figure 4:
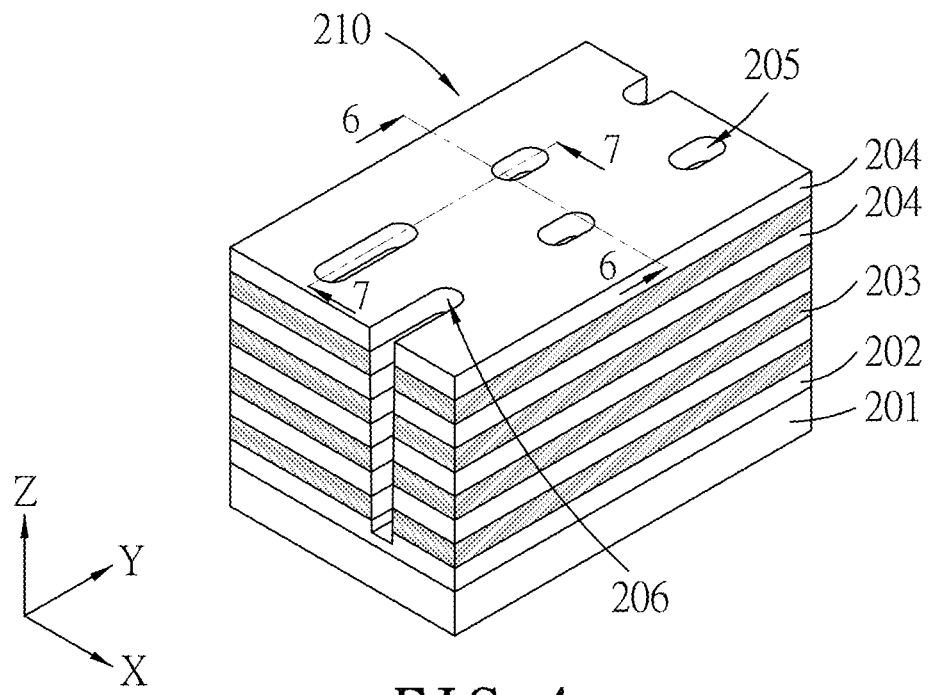
Figure 5:
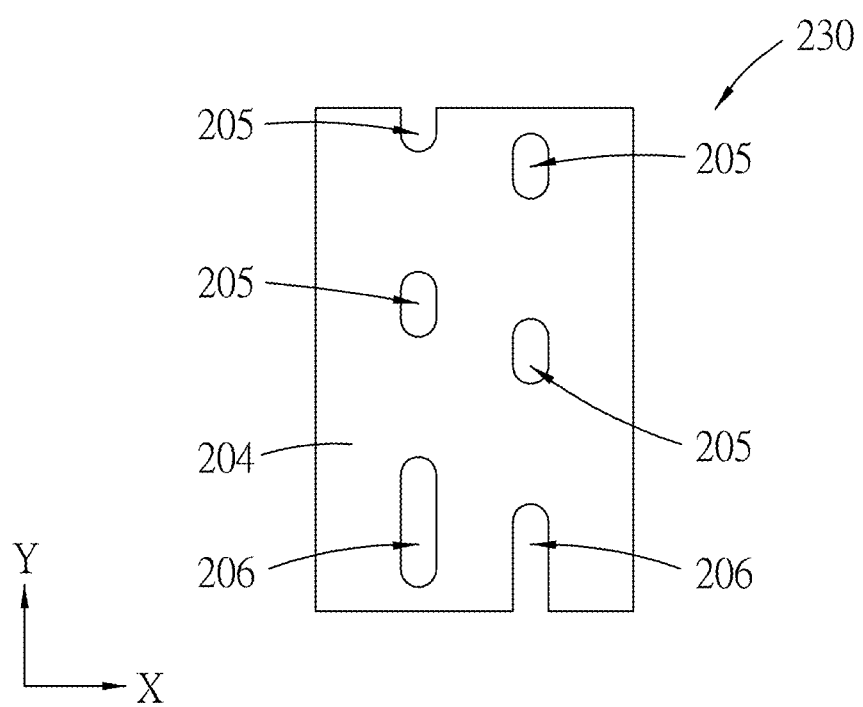
Figure 6:
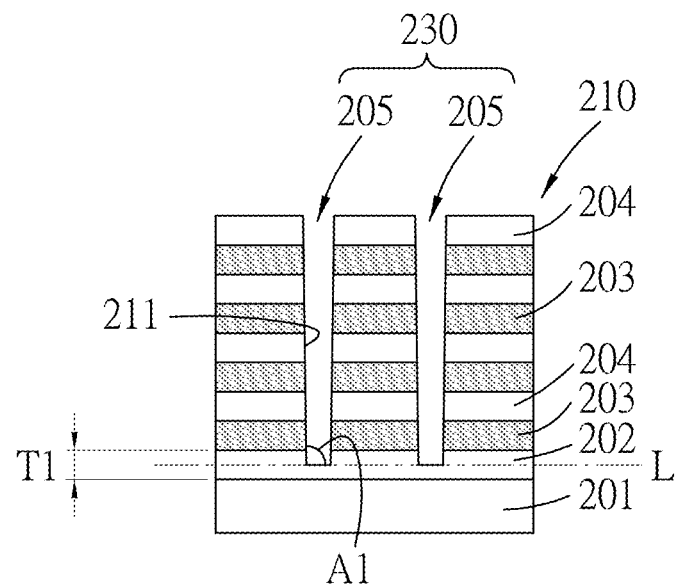
Figure 7:
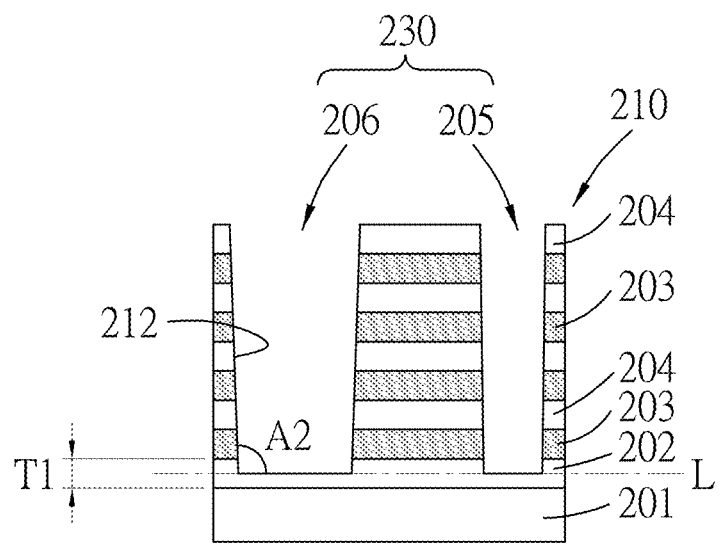

Referring to FIG. 1, the method 100 then proceeds to block 104, where an isolation trench structure is formed in the stack structure. FIGS. 4 to 7 schematically illustrate the step of block 104 of the method 100 in FIG. 1, where FIG. 4 is a schematic perspective view of the device (including the substrate 201 and the stack structure 210), FIG. 5 is a schematic top view of the device, and FIGS. 6 and 7 are schematic sectional views of the device respectively taken from lines 6-6 and 7-7 of FIG. 4. In some embodiments, the stack structure 210 may be etched to form an isolation trench structure 230 which may include a plurality of first isolation trenches 205 and a plurality of second isolation trenches 206. The stack structure 210 may be etched using a suitable technique, such as anisotropic dry etch or the like, with a suitable etchant, such as $CF_4$, $CHF_3$, $CH_2F_2$, Ar, $N_2$, $O_2$, He, any combination thereof, or the like. As schematically shown in FIG. 5, two first isolation trenches 205 and one second isolation trench 206 in the right row of FIG. 5 are substantially aligned with one another in a Y direction which is substantially parallel to the substrate 201. However, in other embodiments, the first isolation trenches 205 and the second isolation trench 206 in the right row of FIG. 5 may be slightly misaligned with one another in the Y direction. Similarly, the two first isolation trenches 205 and one second isolation trench 206 in the left row of FIG. 5 or other first isolation trenches 205 and the second isolation trenches 206 not shown in the figure may be substantially aligned or slightly misaligned with one another in the Y direction. As shown in FIGS. 4 and 5, the first isolation trenches 205 in the left row may be slightly misaligned with the first isolation trenches 205 in the right row in an X direction which is substantially parallel to the substrate 201 and is substantially perpendicular to the Y direction, such that subsequently formed connection wires 228 (see FIGS. 66 to 68) can be closely arranged, details of which will be in the description associated with FIGS. 66 to 68. As shown in FIG. 5, when viewing from above, each of the first isolation trenches 205 and the second isolation trenches 206 may be substantially rectangular and may have four round corners, but other suitable shapes are also within the scope of this disclosure. In some embodiments, as shown in FIG. 5, each of the second isolation trenches 206 may have a length in the Y direction greater than that of each of the first isolation trenches 205. Each of the first isolation trenches 205 and the second isolation trenches 206 may penetrate the stack structure 210 and may terminate at the etch stop layer 202. In a non-limiting example, the etch stop layer 202 is etched away to about half of the thickness (T1) during the formation of the first isolation trenches 205 and the second isolation trenches 206. In some embodiments, each of the first isolation trenches 205 may be defined by a first inner wall 211 of the stack structure 210, which may form a first included angle (A1) with an imaginary plane (L) that is parallel to a Y-X plane or to the substrate 201, as shown in FIGS. 4 and 6. The first included angle (A1) may range from about 90° to about 92°, but other range values are also within the scope of this disclosure. In some embodiments, each of the second isolation trenches 206 may be defined by a second inner wall 212 of the stack structure 210, which may form a second included angle (A2) with the imaginary plane (L), as shown in FIGS. 4 and 7. The second included angle (A2) may range from about 90° to about 92°, but other range values are also within the scope of this disclosure.

Figure 8:
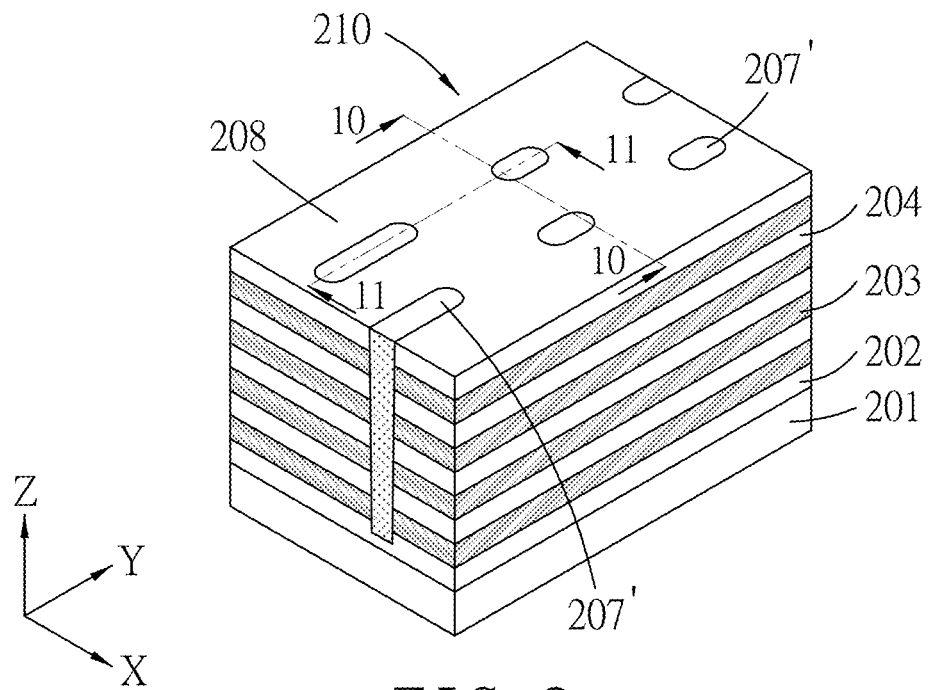
Figure 9:
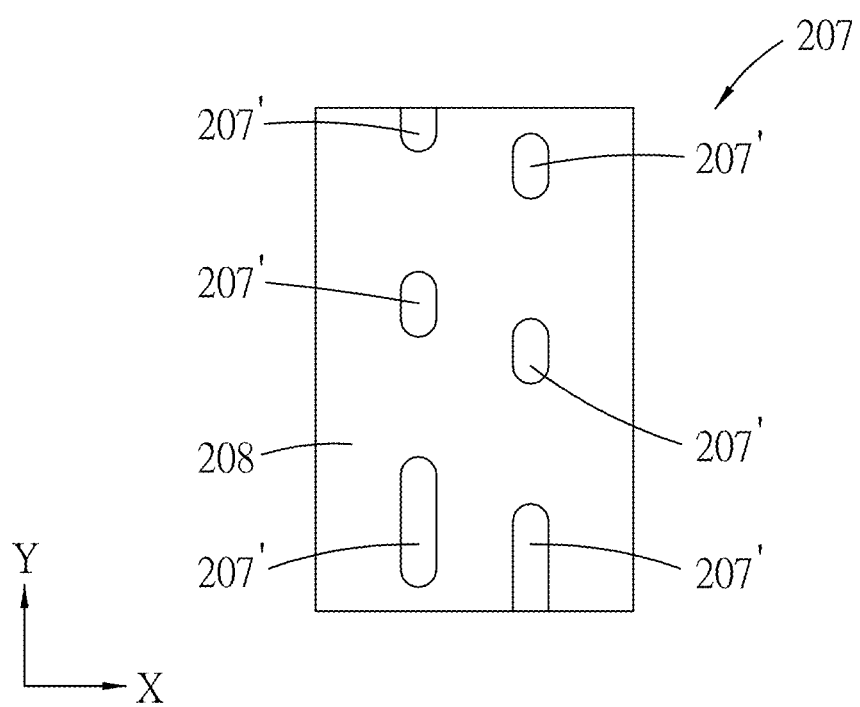
Figure 10:
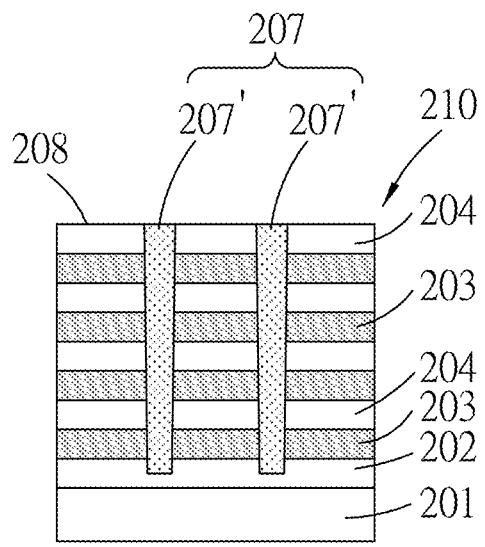
Figure 11:
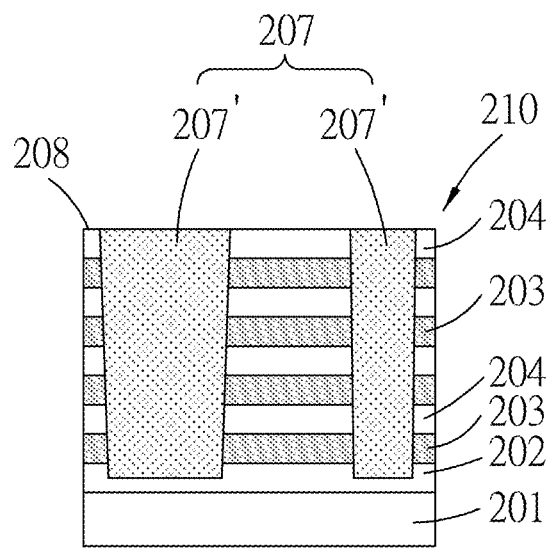

Referring to FIG. 1, the method 100 then proceeds to block 106, where the isolation trench structure is filled with an isolation feature. FIGS. 8 to 11 schematically illustrate the step of block 106 of the method 100 in FIG. 1, where FIG. 8 is a schematic perspective view of the device, FIG. 9 is a schematic top view of the device, and FIGS. 10 and 11 are schematic sectional views of the device respectively taken from lines 10-10 and 11-11 of FIG. 8. In this step, a suitable material, such as an electrically insulating material, including SiOx, SiCN, SiOC, any combination thereof, or the like may be deposited to fill the first isolation trenches 205 and the second isolation trenches 206 of the isolation trench structure 230 (see FIGS. 4 to 7) and may also be deposited on a top surface 208 of the stack structure 210, followed by removing the material on the top surface 208 using a suitable technique, such as chemical mechanical planarization (CMP), etch back, a combination thereof, or the like, so as to form the isolation feature 207 filling the isolation trench structure 230 (see FIGS. 5 to 7). In some embodiments, the isolation feature 207 includes a plurality of isolation segments 207' that respectively fill the first isolation trenches 205 and the second isolation trenches 206 of the isolation trench structure 230 (see FIGS. 4 to 7). In some embodiments, the step of removing the material on the top surface 208 may also partially remove a top sacrificial layer 204 (i.e., the topmost layer of the stack structure 210); in other embodiments, such removing step may also entirely remove the top sacrificial layer 204; and in still other embodiments, such removing step may not etch the top sacrificial layer 204.

Figure 12:
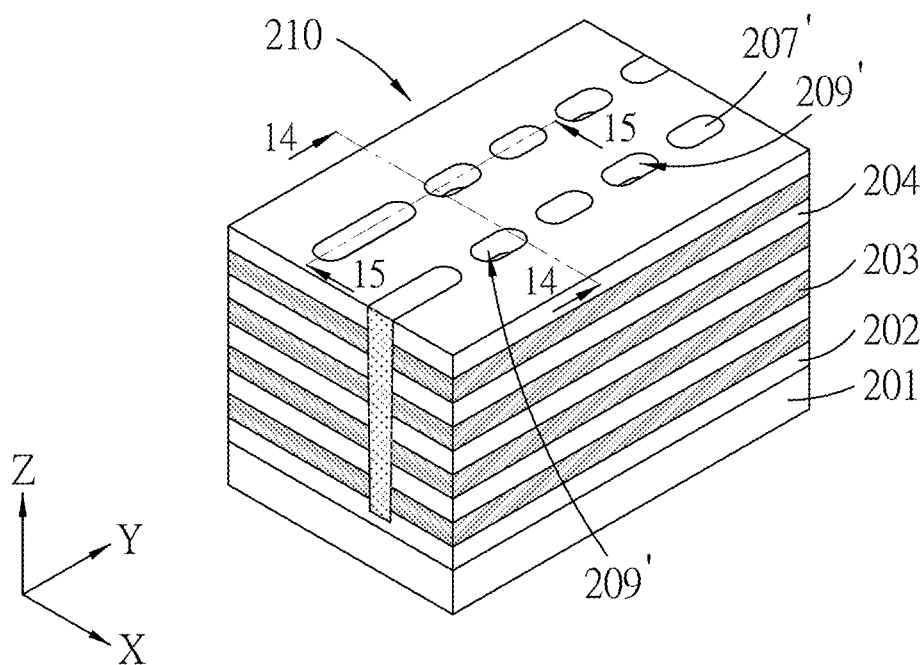
Figure 13:
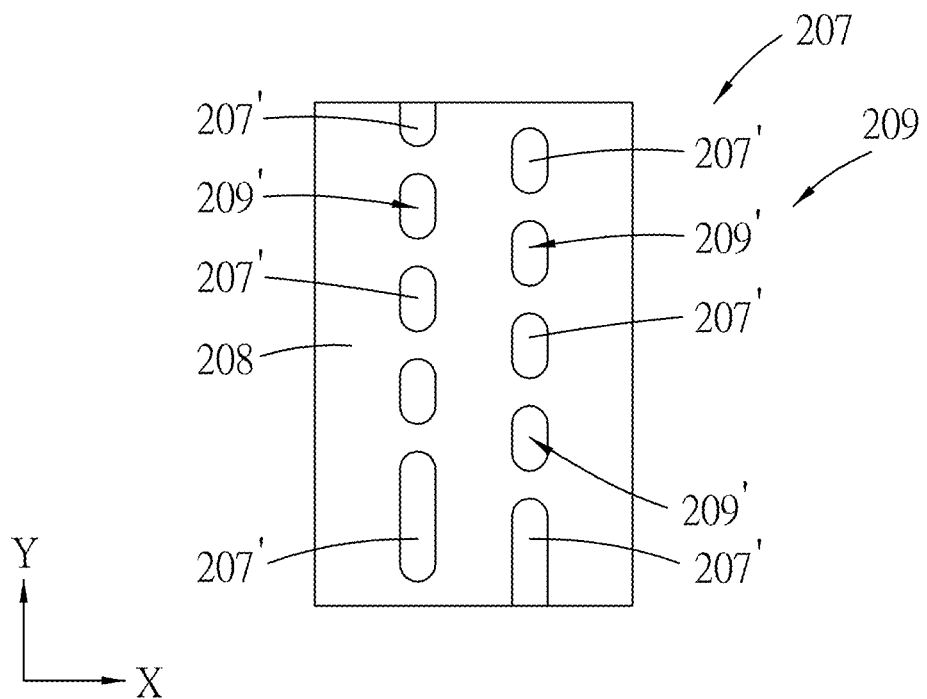
Figure 14:
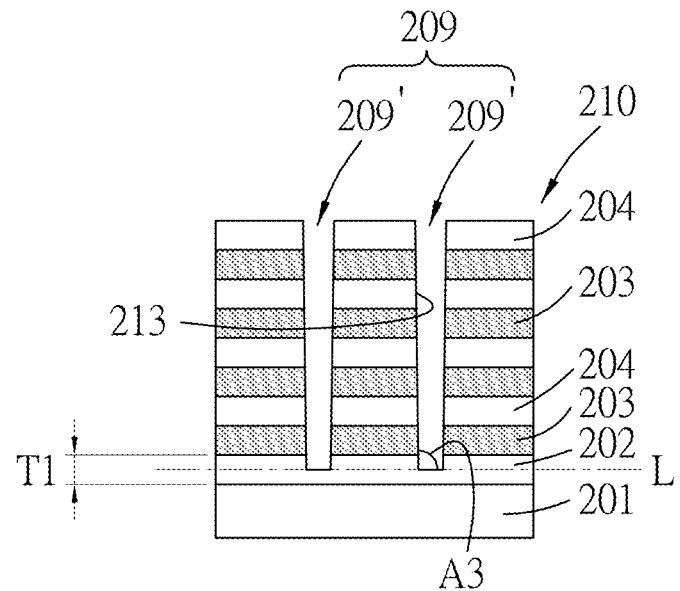
Figure 15:
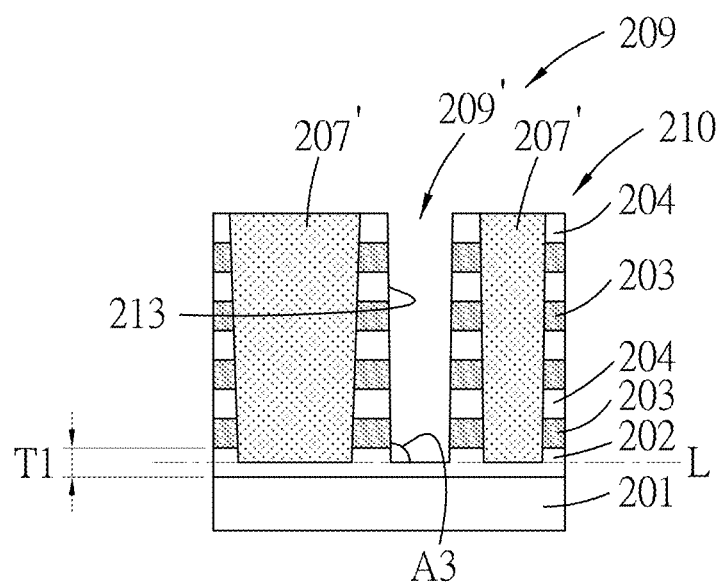

Referring to FIG. 1, the method 100 then proceeds to block 108, where a channel trench structure is formed in the stack structure. FIGS. 12 to 15 schematically illustrate the step of block 108 of the method 100 in FIG. 1, where FIG. 12 is a schematic perspective view of the device, FIG. 13 is a schematic top view of the device, and FIGS. 14 and 15 are schematic sectional views of the device respectively taken from lines 14-14 and 15-15 of FIG. 12. In some embodiments, the stack structure 210 may be etched to form the channel trench structure 209 which may include a plurality of channel trenches 209'. As shown in FIGS. 12 and 13, each of the channel trenches 209' may be disposed between corresponding adjacent two of the isolation segments 207' in the Y direction. In some embodiments, each of the channel trenches 209' may be slightly misaligned with the corresponding adjacent two of the isolation segments 207' in the Y direction, and each of the channel trenches 209' may be slightly closer to one of the corresponding adjacent two of the isolation segments 207'. Referring to FIG. 13, in some embodiments, each of the channel trenches 209' may have a width in the X direction not smaller than about 10 nm. In some embodiments, a length of each of the channel trenches 209' in the Y direction may be greater than the width of the channel trench 209' in the X direction, and each of the length and the width of each channel trench 209' may range from about 10 nm to about 500 nm, but other range vales are also within the scope of this disclosure. The stack structure 210 may be etched using a suitable technique, such as anisotropic dry etch or the like, with a suitable etchant, such as $CF_4$, $CHF_3$, $CH_2F_2$, Ar, $N_2$, $O_2$, He, any combination thereof, or the like. Each of the channel trenches 209' may penetrate the stack structure 210 and may terminate at the etch stop layer 202. In a non-limiting example, the etch stop layer 202 is etched away to about half of the thickness (T1) during the formation of the channel trenches 209'. In some embodiments, each of the channel trenches 209' may be defined by a third inner wall 213 of the stack structure 210, which may form a third included angle (A3) with the imaginary plane (L) that is parallel to the Y-X plane or to the substrate 201, as shown in FIGS. 12, 14 and 15. In some embodiments, the third included angle (A3) may range from about 90° to about 92°, but other range values are also within the scope of this disclosure.

Figure 16:
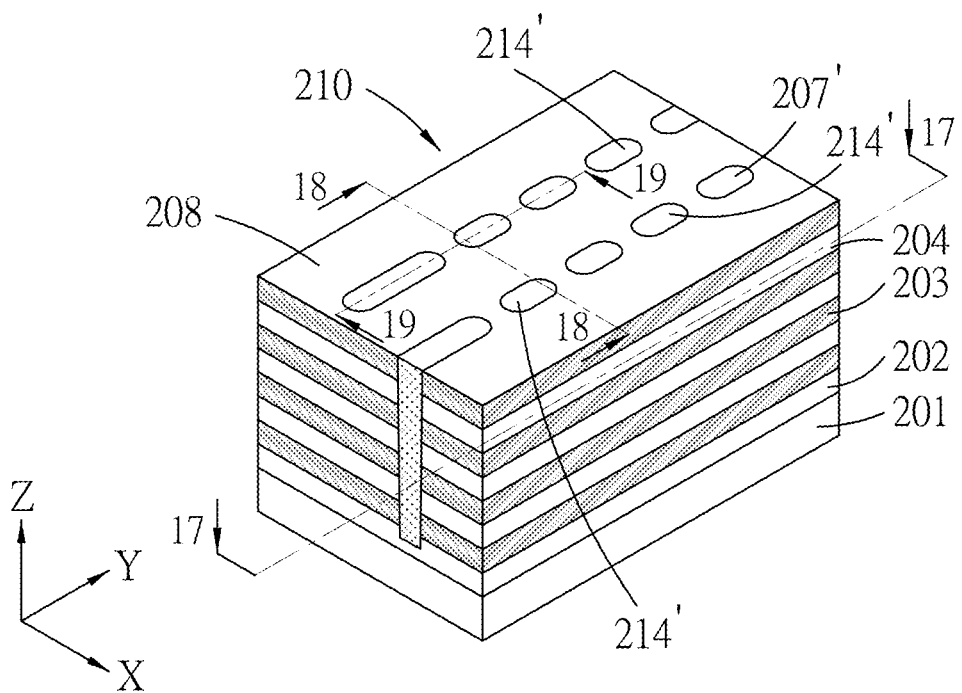
Figure 17:
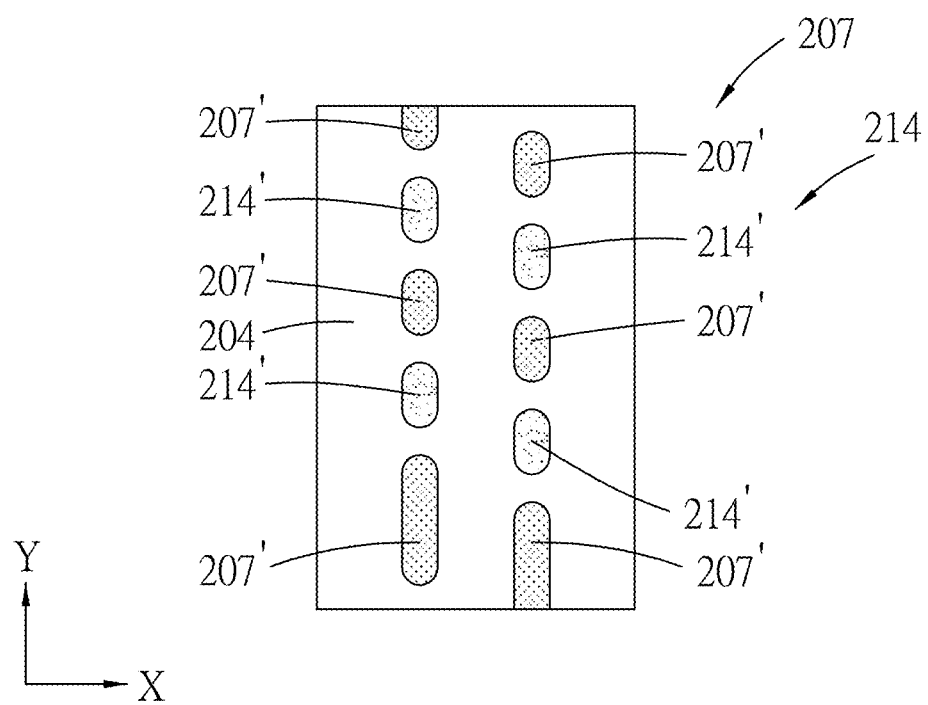
Figure 18:
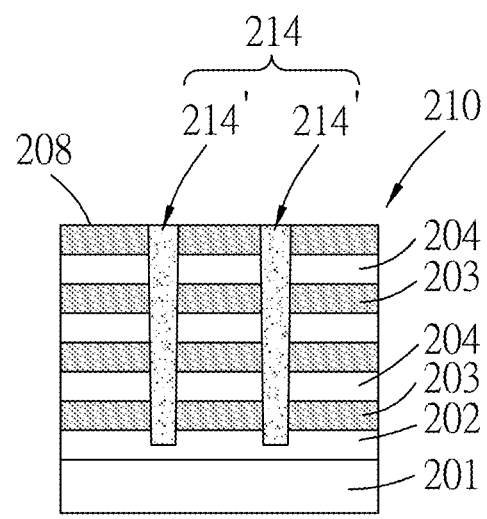
Figure 19:
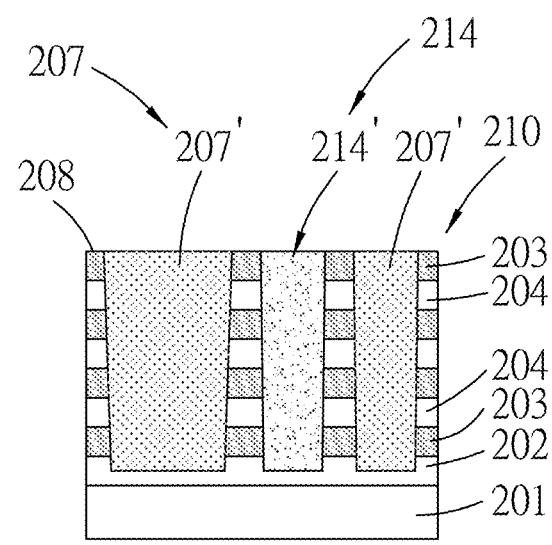

Referring to FIG. 1, the method 100 then proceeds to block 110, where the channel trench structure is filled with a first sacrificial feature. FIGS. 16 to 19 schematically illustrate the step of block 110 of the method 100 in FIG. 1, where FIG. 16 is a schematic perspective view of the device, and FIGS. 17 to 19 are schematic sectional views of the device respectively taken from lines 17-17, 18-18 and 19-19 of FIG. 16. In this step, a suitable material, such as $Si_3N_4$, amorphous silicon, a combination thereof, or the like, may be deposited to fill the channel trenches 209' of the channel trench structure 209 (see FIGS. 12 to 15) and may also be deposited on the top surface 208 of the stack structure 210, followed by removing the material on the top surface 208 using a suitable technique, such as CMP, etch back, a combination thereof, or the like, to form the first sacrificial feature 214 filling the channel trench structure 209 (see FIGS. 13 to 15). In some embodiments, the first sacrificial feature 214 includes a plurality of first sacrificial segments 214' that respectively fill the channel trenches 209' of the channel trench structure 209 (see FIGS. 12 to 15). In this embodiment, the step of removing the material on the top surface 208 is illustrated to entirely remove the top sacrificial layer 204 shown in FIGS. 12 to 15. However, in other embodiments, only part of the top sacrificial layer 204 in FIGS. 12 to 15 is removed; and in still other embodiments, the top sacrificial layer 204 is not etched or removed.

Figure 20:
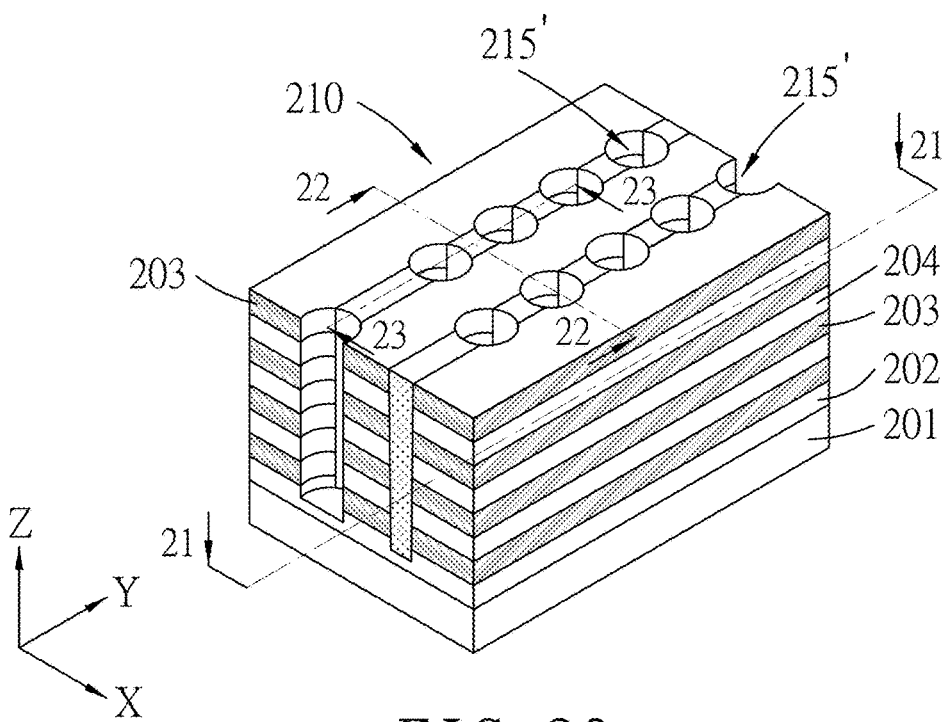
Figure 21:
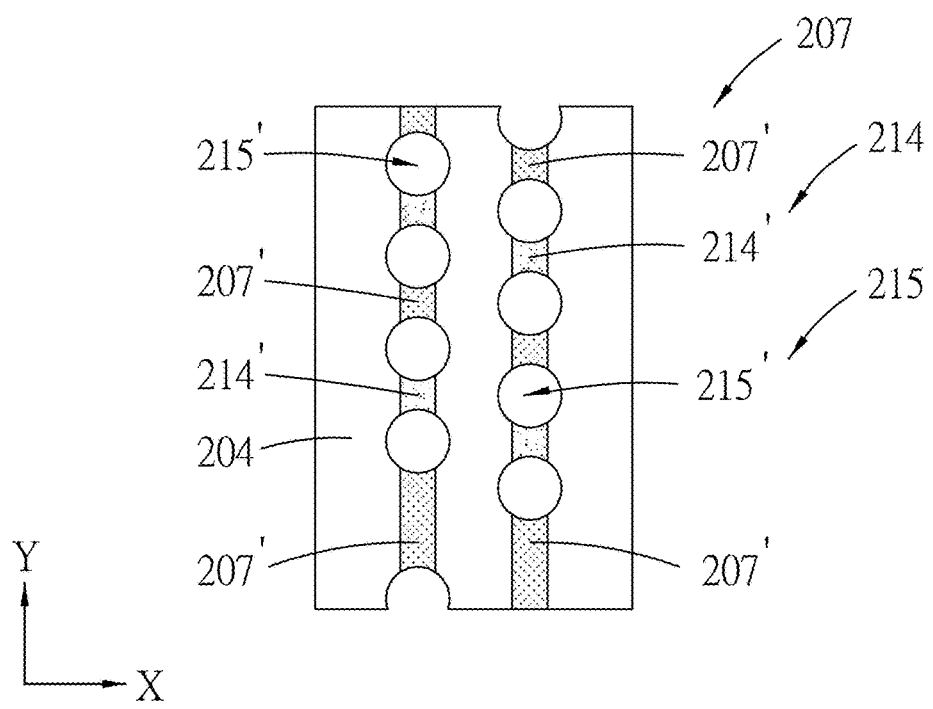
Figure 22:
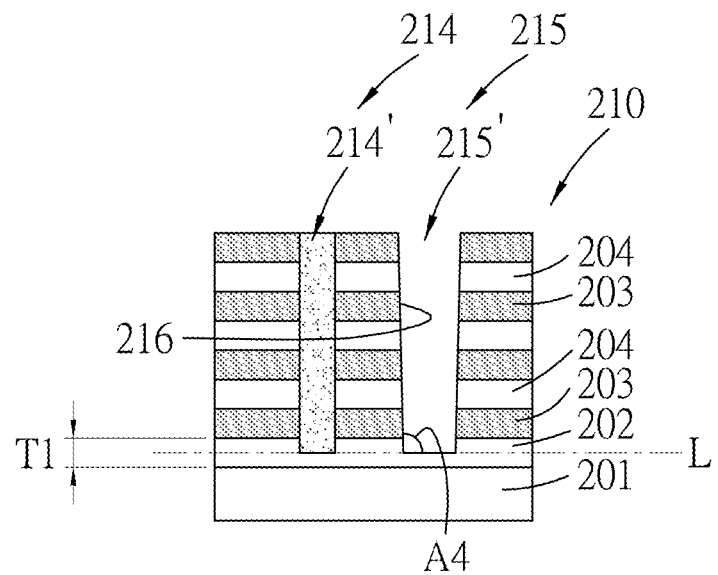
Figure 23:
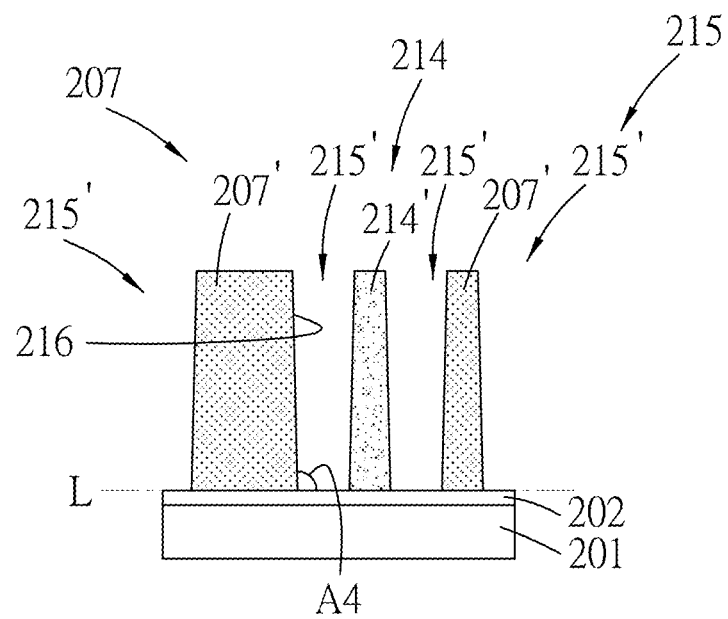

Referring to FIG. 1, the method 100 then proceeds to block 112, where a source/drain trench structure is formed in the stack structure. FIGS. 20 to 23 schematically illustrate the step of block 112 of the method 100 in FIG. 1, where FIG. 20 is a schematic perspective view of the device, and FIGS. 21 to 23 are schematic sectional views of the device respectively taken from lines 21-21, 22-22 and 23-23 of FIG. 20. In some embodiments, the stack structure 210, the first sacrificial feature 214 and the isolation feature 207 may be etched to form the source/drain trench structure 215 which may include a plurality of source/drain trenches 215'. As shown in FIGS. 20 and 21, each of the source/drain trenches 215' may be formed by etching the stack structure 210, a portion of a corresponding one of the isolation segments 207' and a portion of a corresponding one of the first sacrificial segments 214', and may be disposed between the corresponding isolation segment 207' and the corresponding first sacrificial segment 214' in the Y direction. In some embodiments, each of the source/drain trenches 215' may be slightly misaligned with the corresponding isolation segment 207' and the corresponding first sacrificial segment 214' in the Y direction, and each of the source/drain trenches 215' may be slightly closer to one of the corresponding isolation segment 207' and the corresponding first sacrificial segment 214'. In this embodiment, as shown in FIGS. 20 and 21, each of the source/drain trenches 215' is substantially circular when viewed from above; but, in other embodiments, each of the source/drain trenches 215' may be oval, rectangular or have other suitable shapes when viewed from above. Referring to FIG. 21, in some embodiments, a maximum width of each of the source/drain trenches 215' in the X direction may be greater than the width of the corresponding first sacrificial segment 214' in the X direction. The stack structure 210, the corresponding first sacrificial feature 214 and the corresponding isolation feature 207 may be etched using a suitable technique, such as anisotropic dry etch or the like, with a suitable etchant, such as $CF_4$, $CHF_3$, $CH_2F_2$, Ar, $N_2$, $O_2$, He, any combination thereof, or the like. Each of the source/drain trenches 215' may penetrate the stack structure 210, the corresponding first sacrificial feature 214 and the corresponding isolation feature 207 and may terminate at the etch stop layer 202. In a non-limiting example, the etch stop layer 202 is etched away to about half of the thickness (T1) during the formation of the source/drain trenches 215'. In some embodiments, each of the source/drain trenches 215' may be defined by a fourth inner wall 216 which is defined by the stack structure 210, the isolation feature 207, and the first sacrificial feature 214. The fourth inner wall 216 may form a fourth included angle (A4) with the imaginary plane (L) that is parallel to the Y-X plane or the substrate 201, as shown in FIGS. 20, 22 and 23. The fourth included angle (A4) may range from about 90° to about 92°, but other range values are also within the scope of this disclosure.

Figure 24:
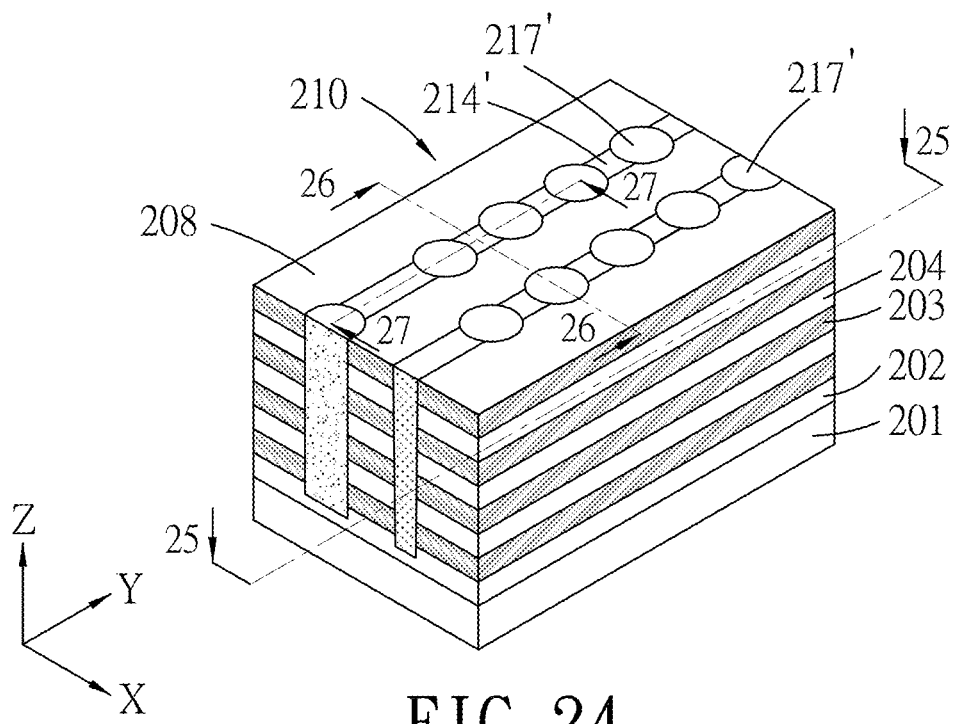
Figure 25:
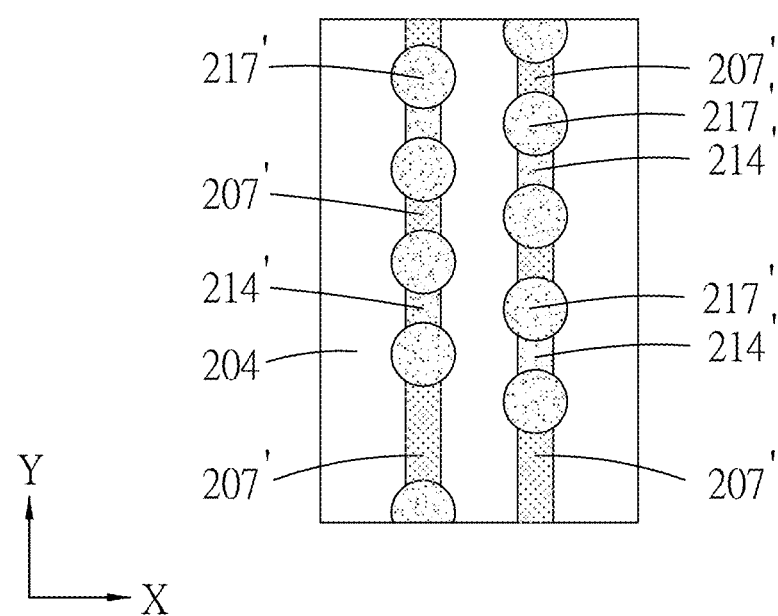
Figure 26:
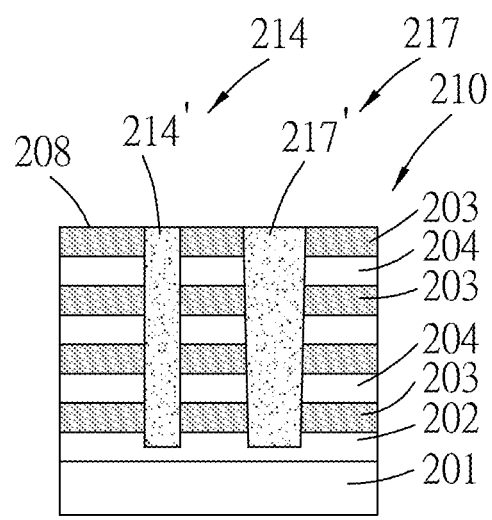
Figure 27:
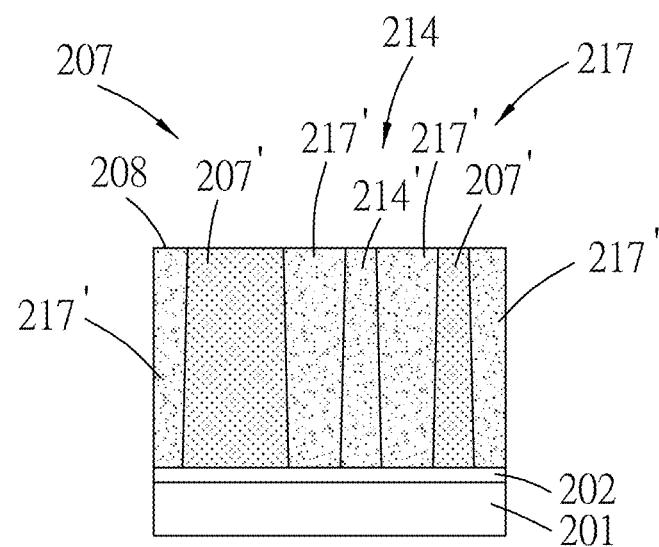

Referring to FIG. 1, the method 100 then proceeds to block 114, where the source/drain trench structure is filled with a second sacrificial feature. FIGS. 24 to 27 schematically illustrate the step of block 114 of the method 100 in FIG. 1, where FIG. 24 is a schematic perspective view of the device, and FIGS. 25 to 27 are schematic sectional views of the device respectively taken from lines 25-25, 26-26 and 27-27 of FIG. 24. In this step, a suitable material, such as $Si_3N_4$, amorphous silicon, a combination thereof, or the like, may be deposited to fill the source/drain trenches 215' of the source/drain trench structure 215 (see FIGS. 20 to 23) and may also be deposited on the top surface 208 of the stack structure 210, followed by removing the material on the top surface 208 using a suitable technique, such as CMP, etch back, a combination thereof, or the like, so as to form the second sacrificial feature 217 filling the source/drain trench structure 215 (see FIGS. 20 to 23). In some embodiments, the first sacrificial feature 214 and the second sacrificial feature 217 may be made of the same material; and, in other embodiments, the first sacrificial feature 214 and the second sacrificial feature 217 may be made of different materials. In some embodiments, the second sacrificial feature 217 includes a plurality of second sacrificial segments 217' that respectively fill the source/drain trenches 215' of the source/drain trench structure 215 (see FIGS. 20 to 23). In some embodiments, the step of removing the material on the top surface 208 may also partially remove the top dielectric layer 203; in other embodiments, such removing step may also entirely remove the top dielectric layer 203; and in still other embodiments, such removing step may not etch the top dielectric layer 203.

Figure 28:
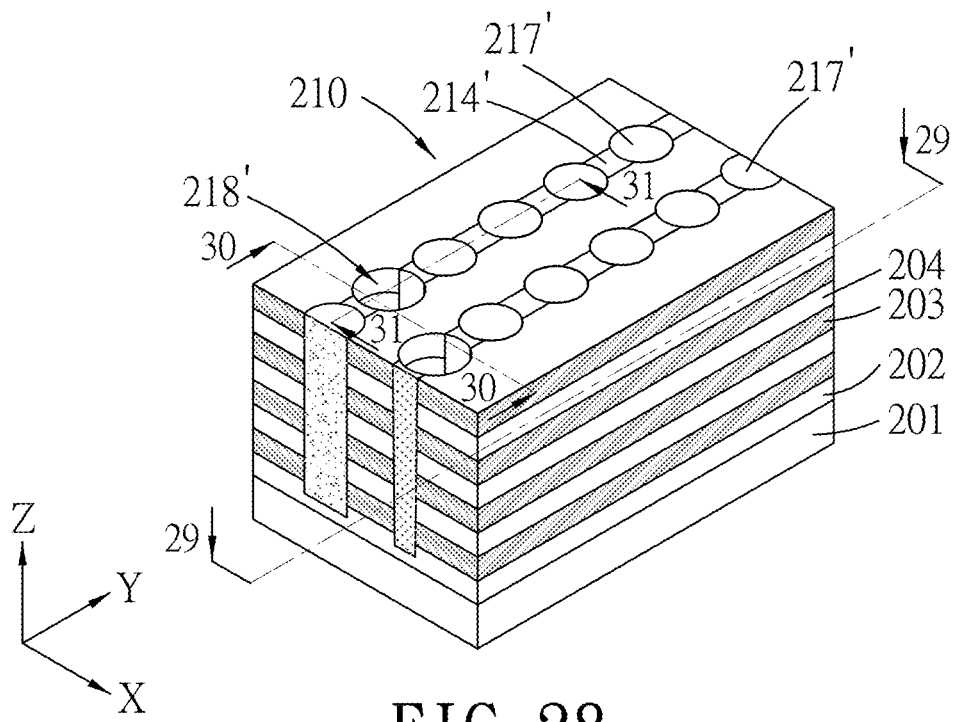
Figure 29:
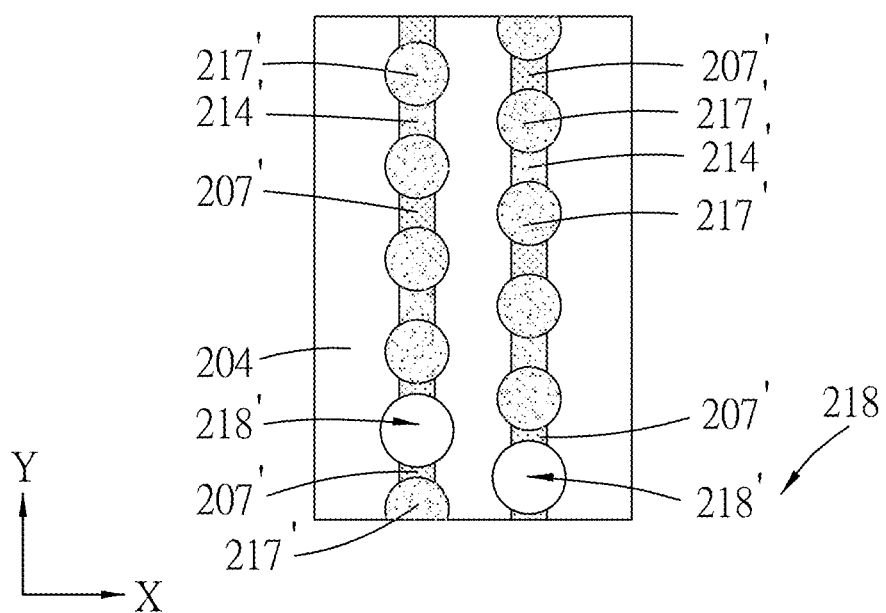
Figure 30:
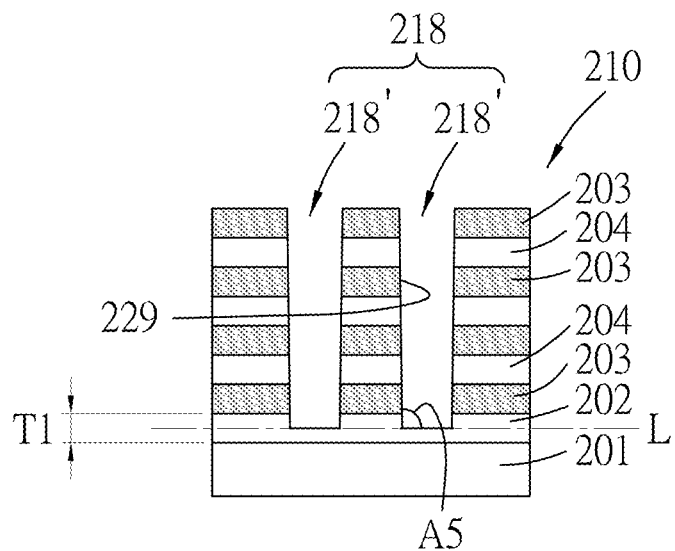
Figure 31:
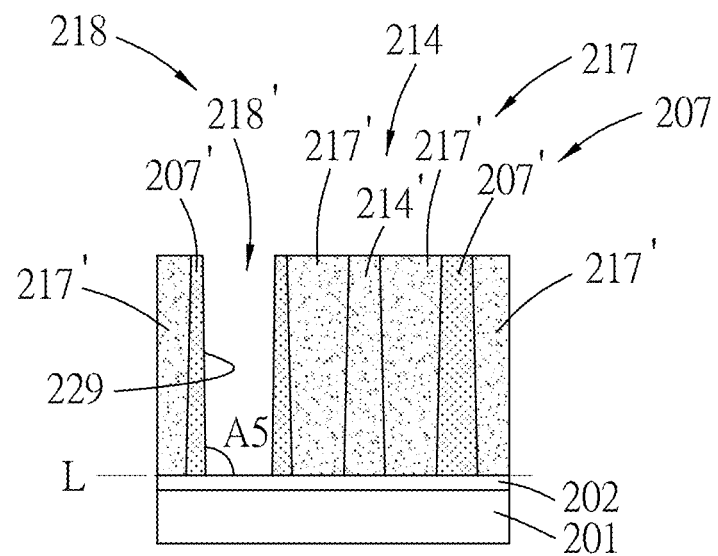

Referring to FIG. 1, the method 100 then proceeds to block 116, where a through hole structure is formed in the stack structure. FIGS. 28 to 31 schematically illustrate the step of block 116 of the method 100 in FIG. 1, where FIG. 28 is a schematic perspective view of the device, and FIGS. 29 to 31 are schematic sectional views of the device respectively taken from lines 29-29, 30-30 and 31-31 of FIG. 28. In some embodiments, the stack structure 210 and two of the isolation segments 207' filling the second isolation trenches 206 shown in FIGS. 4, 5 and 7 (see the two isolation segments 207' in FIG. 29) may be etched to form the through hole structure 218 which may include a plurality of through holes 218'. As shown in FIGS. 28 and 29, each of the through holes 218' may be formed by etching the stack structure 210 and a portion of a corresponding one of the isolation segments 207' to allow the sacrificial layers 204 to be exposed to the ambient environment through the through holes 218', thereby facilitating removal of the sacrificial layers 204 and growth of a conductive structure 220 (see FIGS. 36 and 37), both of which will be described in detail hereinafter. In some embodiments, each of the through holes 218' may be slightly misaligned the corresponding second sacrificial segment 217' in the Y direction. In this embodiment, as shown in FIGS. 28 and 29, each of the through holes 218' is substantially circular when viewed from above, but, in other embodiments, each of the through holes 218' may be oval, rectangular or have other suitable shapes when viewed from above. Referring to FIG. 29, in some embodiments, a maximum width of each of the through holes 218' in the X direction may be greater than the width of the corresponding isolation segment 207' in the X direction to ensure that the sacrificial layers 204 are exposed to the ambient environment through the through holes 218'. The stack structure 210 and the corresponding isolation segment 207' may be etched using a suitable technique, such as anisotropic dry etch or the like, with a suitable etchant, such as $CF_4$, $CHF_3$, $CH_2F_2$, Ar, $N_2$, $O_2$, He, any combination thereof, or the like. Each of the through holes 218' may penetrate the stack structure 210 and the corresponding isolation segment 207', and may terminate at the etch stop layer 202. In a non-limiting example, the etch stop layer 202 is etched away to about half of the thickness (T1) during the formation of the through holes 218'. In some embodiments, each of the through holes 218' may be defined by a fifth inner wall 229 which is defined by the stack structure 210 and the isolation feature 207, and the fifth inner wall 229 may form a fifth included angle (A5) with the imaginary plane (L) that is parallel to the Y-X plane or the substrate 201, as shown in FIGS. 28, 30 and 31. The fifth included angle (A5) may range from about 90° to about 92°, but other range values are also within the scope of this disclosure.

Figure 32:
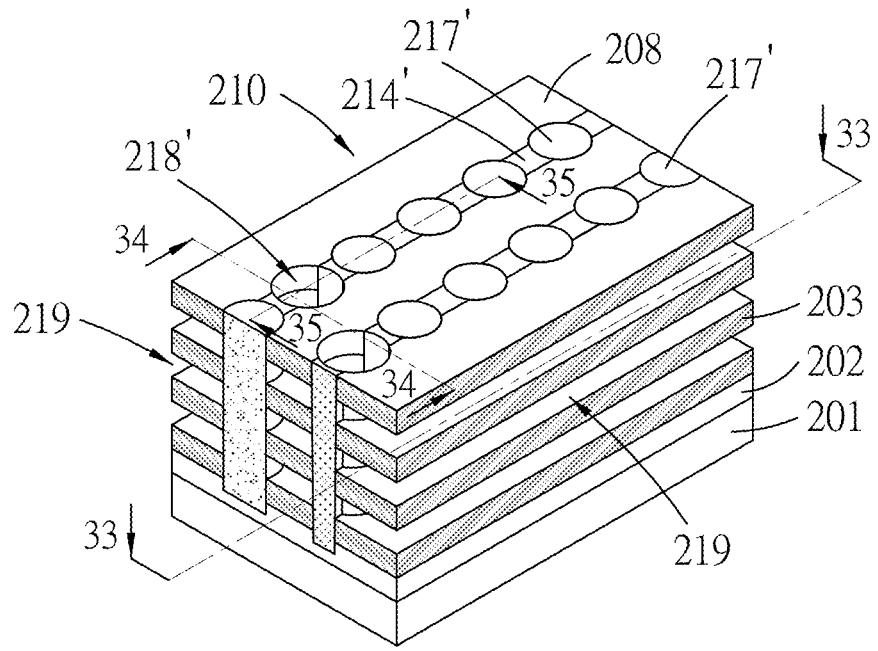
Figure 33:
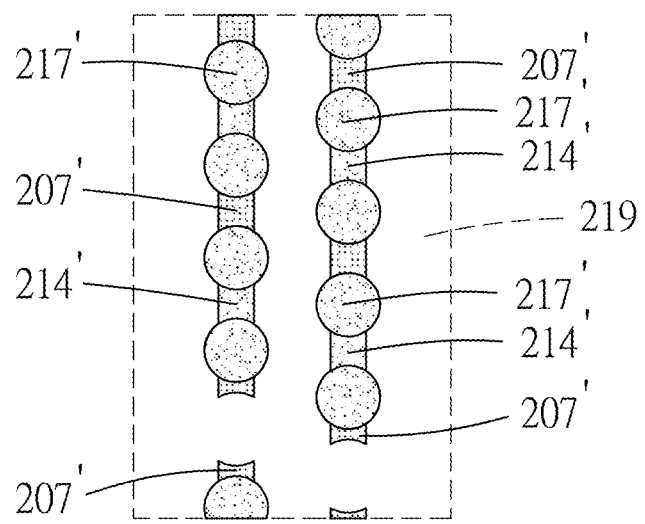
Figure 34:
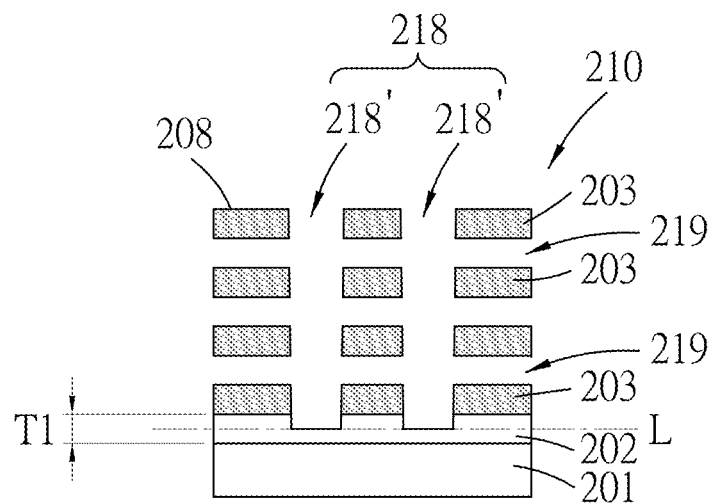
Figure 35:
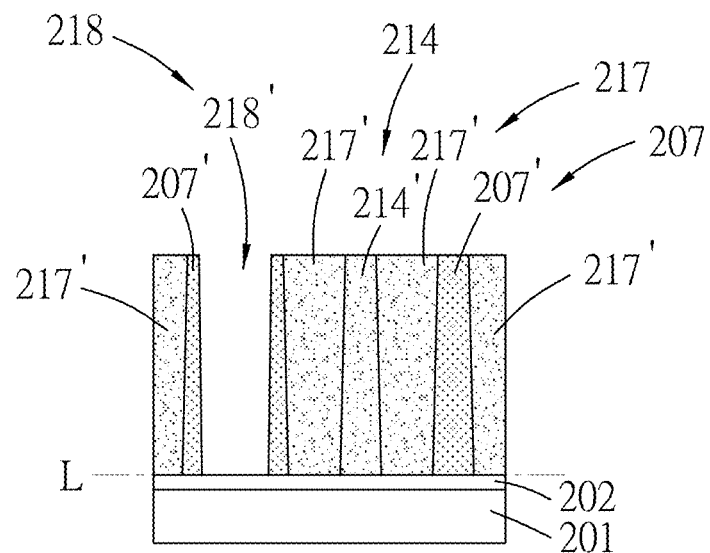

Referring to FIG. 1, the method 100 then proceeds to block 118, where the sacrificial layers of the stack structure are removed. FIGS. 32 to 35 schematically illustrate the step of block 118 of the method 100 in FIG. 1, where FIG. 32 is a schematic perspective view of the device, and FIGS. 33 to 35 are schematic sectional views of the device respectively taken from lines 33-33, 34-34 and 35-35 of FIG. 32. In some embodiments, the device is treated with a suitable etchant, such as phosphoric acid or the like, and a portion of the etchant may enter the through holes 218' of the through hole structure 218 to etch away the sacrificial layers 204 of the stack structure 210 (see FIGS. 28 and 30) so as to form a plurality of spaces 219, while leaving the isolation feature 207, the first sacrificial feature 214, the second sacrificial feature 217 and the dielectric layers 203 substantially unetched or slightly etched. The spaces 219 are spatially communicated with the through hole structure 218.

Figure 36:
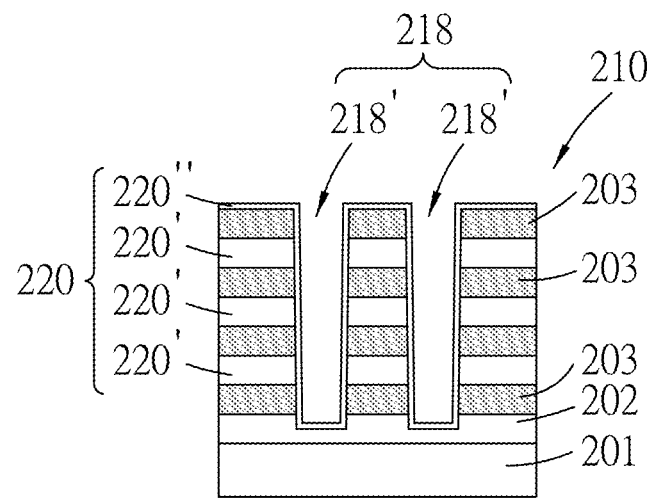
Figure 37:
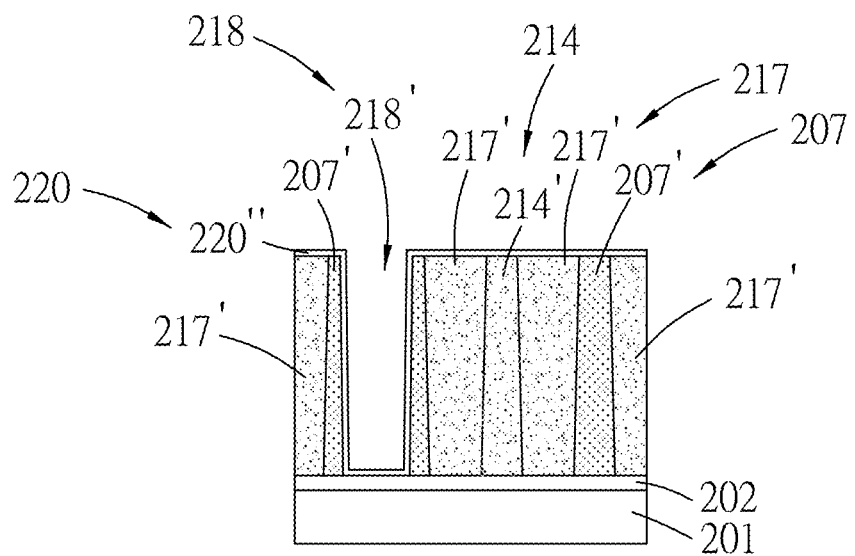

Referring to FIG. 1, the method 100 then proceeds to block 120, where the conductive structure is formed. FIGS. 36 and 37 are schematic sectional views similar to FIGS. 34 and 35, but FIGS. 36 and 37 further shows the conductive structure 220. Referring to FIGS. 32 to 37, in some embodiments, the conductive structure 220 may be formed by subjecting the device to be in contact with a suitable precursor material. The precursor material enters the spaces 219 through the through holes 218' of the through hole structure 218 so as to form a plurality of conductive layers 220' respectively filling the spaces 219. In some embodiments, a conductive portion 220" is also formed from the precursor material, and may cover the top surface 208 of the stack structure 210 and the fifth inner wall 229 that is defined by the stack structure 210 and the isolation feature 207 (see FIGS. 30 and 31). In other words, the conductive structure 220 includes the conductive layers 220' and the conductive portion 220", and may be made of polysilicon (doped or undoped), silicide (TiSi, CoSi, SiGe or the like), oxide semiconductor (InZnO, InGaZnO or the like), metal (Al, Cu, W, Ti, Co, Ni, Ru, TiN, TaN, TaAlN or the like), any combination thereof, or the like. The conductive structure 220 may be formed using a suitable technique, such as CVD, ALD, electroplating, electroless plating, any combination thereof, or the like.

Figure 38:
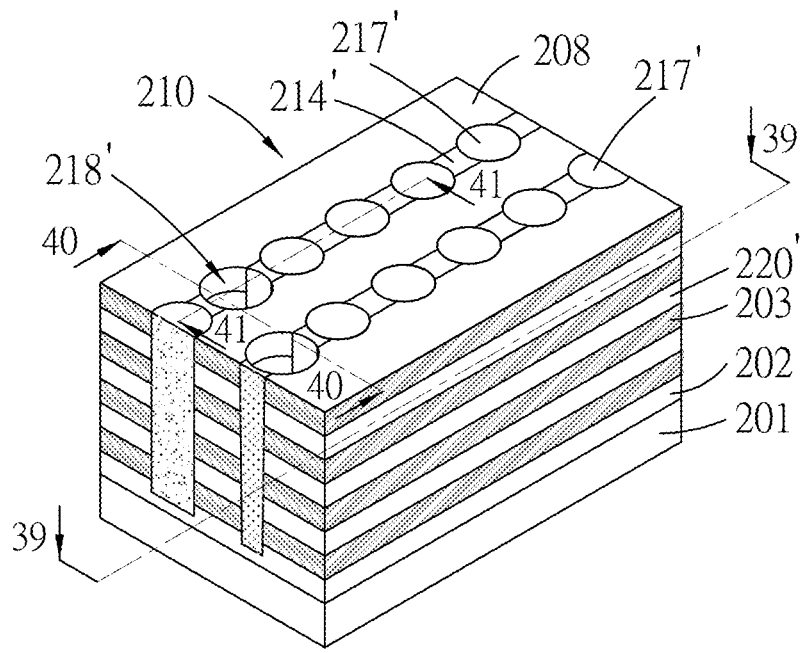
Figure 39:
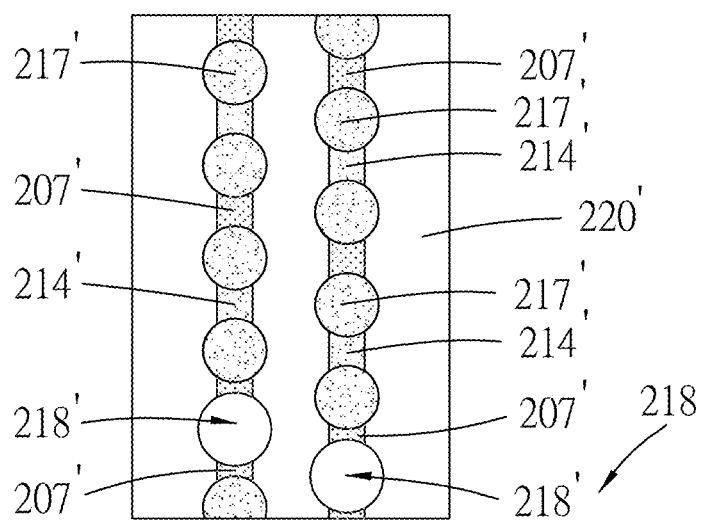
Figure 40:
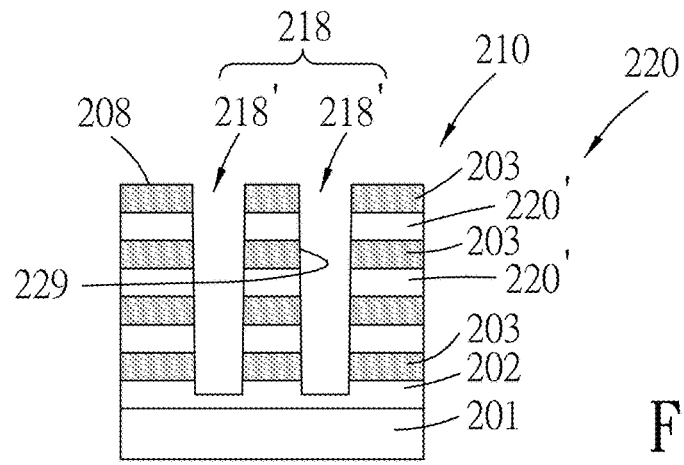
Figure 41:
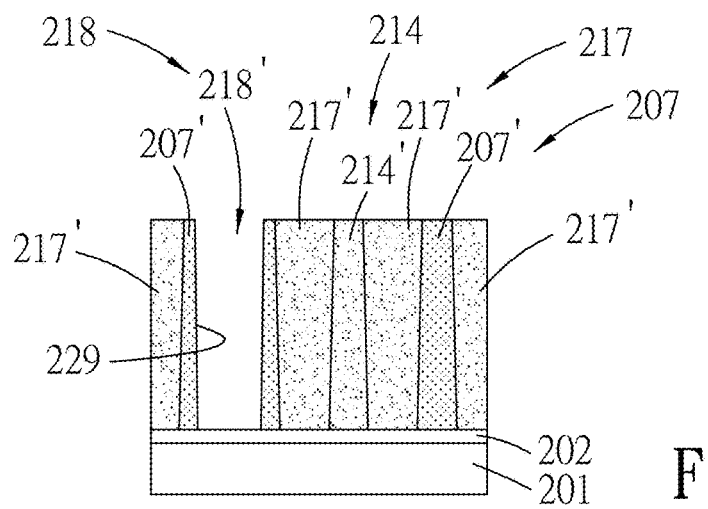
Figure 42:
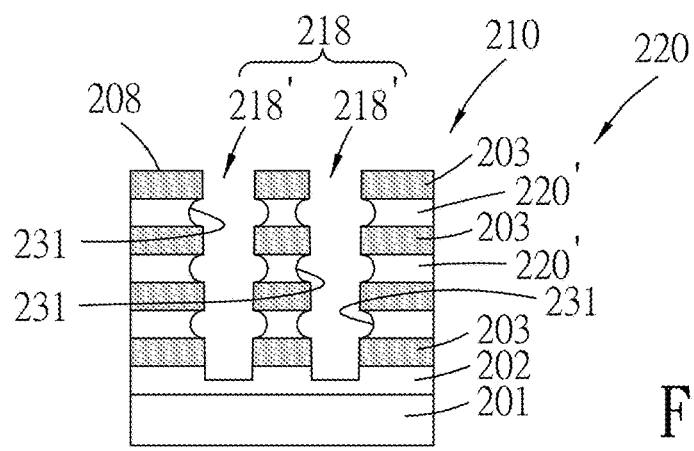

Referring to FIG. 1, the method 100 then proceeds to block 122, where the conductive structure is etched. FIGS. 38 to 41 schematically illustrate the step of block 122 of the method 100 in FIG. 1, where FIG. 38 is a schematic perspective view of the device, and FIGS. 39 to 41 are schematic sectional views of the device respectively taken from lines 39-39, 40-40 and 41-41 of FIG. 38. In some embodiments, the conductive structure 220 is etched using a suitable technique, such as wet etching, etch back, a combination thereof, or the like, to remove the conductive portion 220" (see FIGS. 36 and 37) so as to expose the top surface 208 of the stack structure 210 and the fifth inner wall 229 while leaving the conductive layers 220' substantially unetched or slightly etched. Referring to FIG. 42, in some embodiments, sidewalls 231 of the conductive layers 220' exposed from the through holes 218' of the through hole structure 218 may be slightly etched as schematically shown, but may be present in other figures in subsequent processes.

Figure 43:
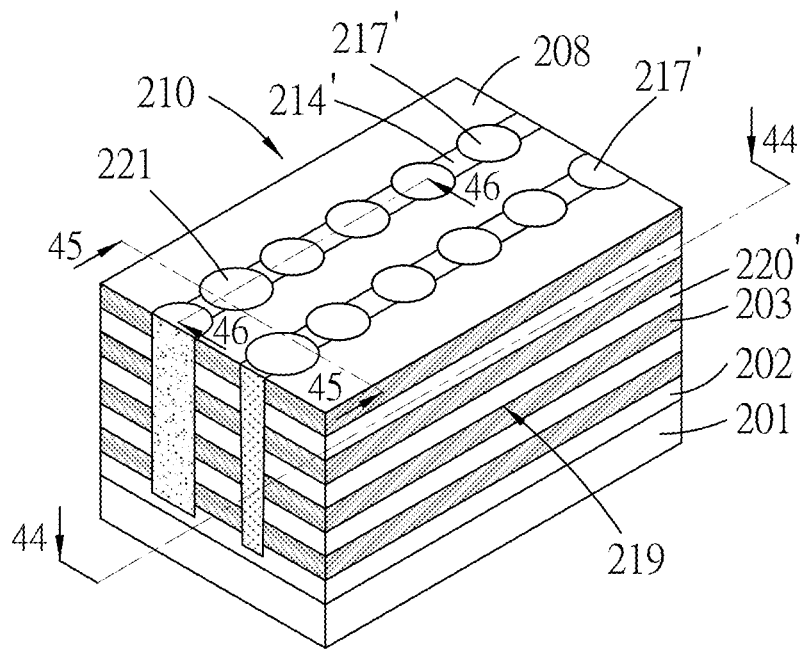
Figure 44:
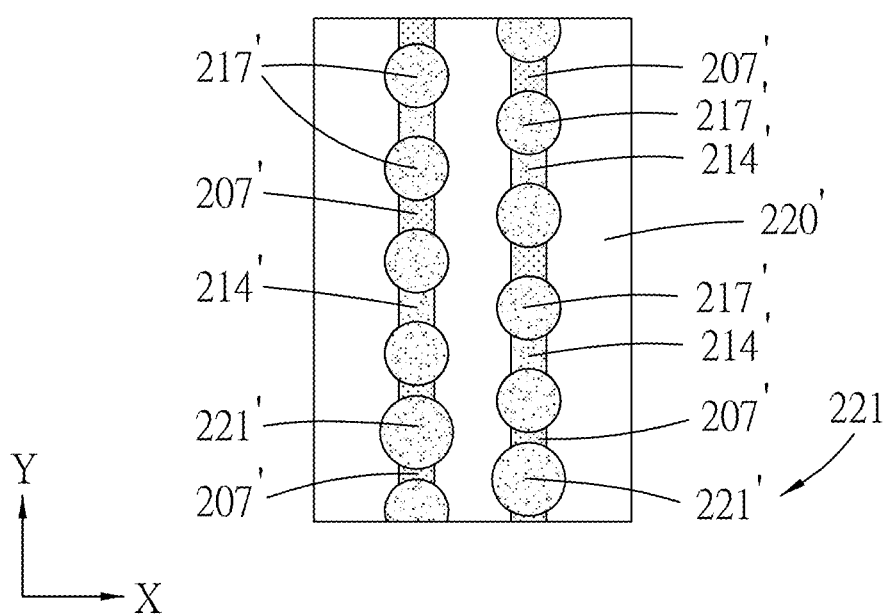
Figure 45:
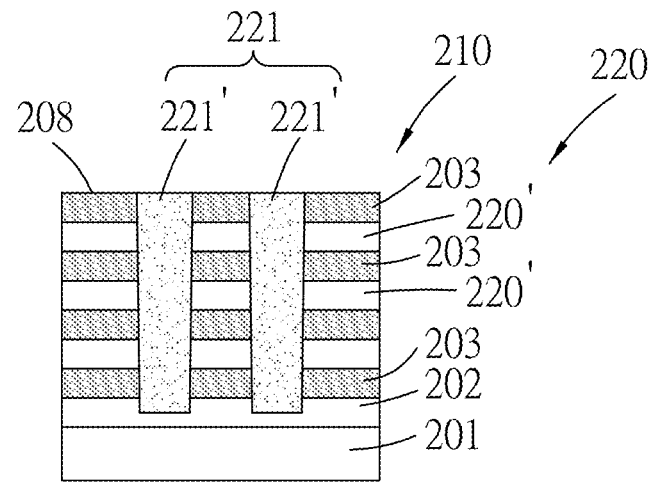
Figure 46:
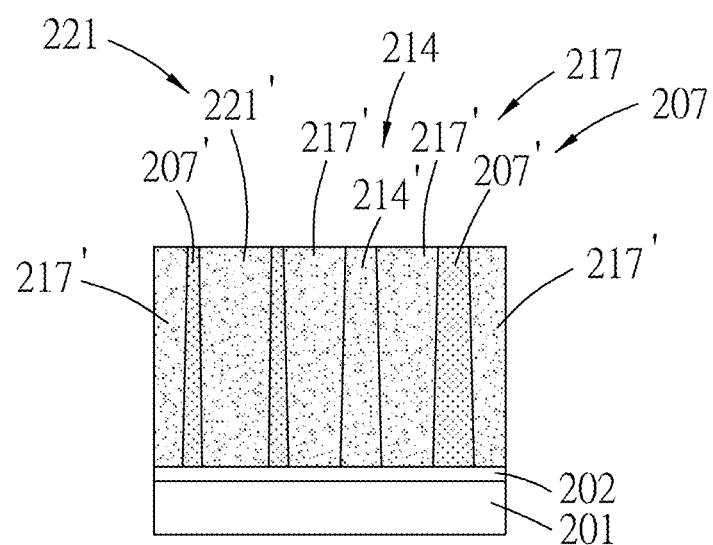

Referring to FIG. 1, the method 100 then proceeds to block 124, where the through hole structure is filled with a refill feature. FIGS. 43 to 46 schematically illustrate the step of block 124 of the method 100 in FIG. 1, where FIG. 43 is a schematic perspective view of the device, and FIGS. 44 to 46 are schematic sectional views of the device respectively taken from lines 44-44, 45-45 and 46-46 of FIG. 43. In this step, a suitable material, such as an electrically insulating material (e.g., a dielectric material), including SiOx, SiCN, SiOC, any combination thereof, or the like, may be deposited to fill the through holes 218' of the through hole structure 218 (see FIGS. 38 to 41) and may also be deposited on the top surface 208 of the stack structure 210, followed by removing the material on the top surface 208 using a suitable technique, such as CMP, etch back, a combination thereof, or the like, to form the refill feature 221 filling the through hole structure 218. In some embodiments, the refill feature 221 includes a plurality of refill segments 221' that respectively fill the through holes 218' penetrating the corresponding one of the isolation segments 207'. In some embodiments, a maximum width of each of the refill segments 221' in the X direction is greater than a maximum width of the corresponding one of the isolation segments 207' in the X direction. In some embodiments, the step of removing the material on the top surface 208 may partially remove the top dielectric layer 203; in other embodiments, such removing step may entirely remove the top dielectric layer 203; and in still other embodiments, such removing step may not etch the dielectric layer 203. In some embodiments, the refill segments 221' of the refill feature 221 and the isolation segments 207' of the isolation feature 207 may be made of the same materials; and in other embodiments, the refill segments 221' of the refill feature 221 and the isolation segments 207' of the isolation feature 207 may be made of different materials.

Figure 47:
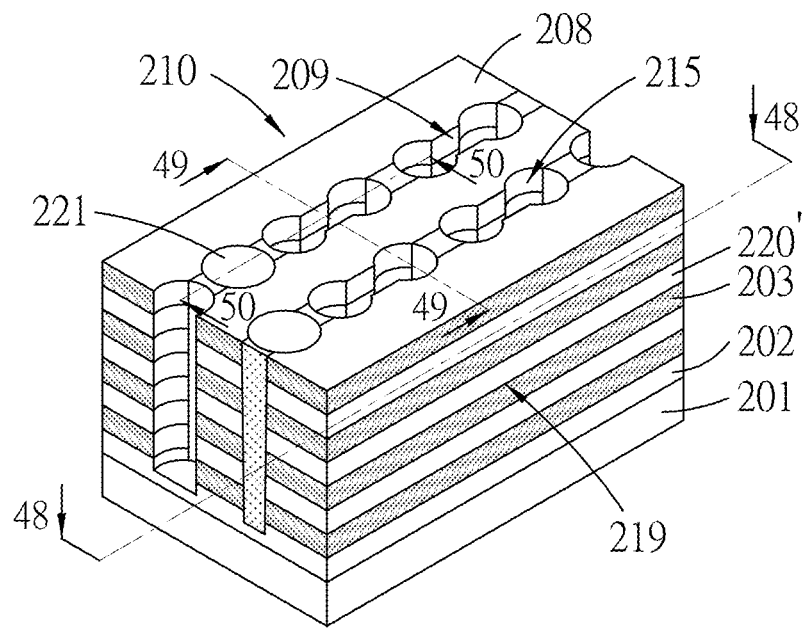
Figure 48:
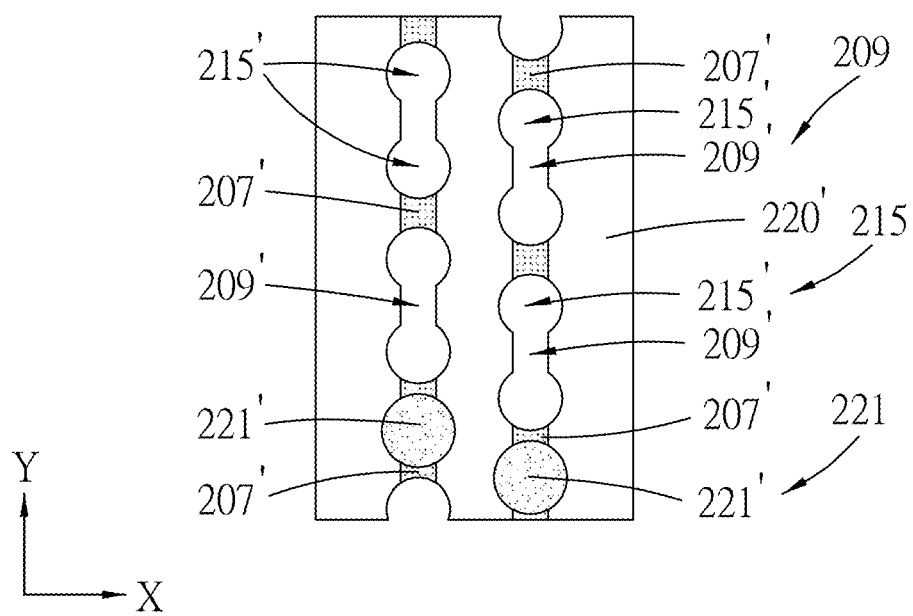
Figure 49:
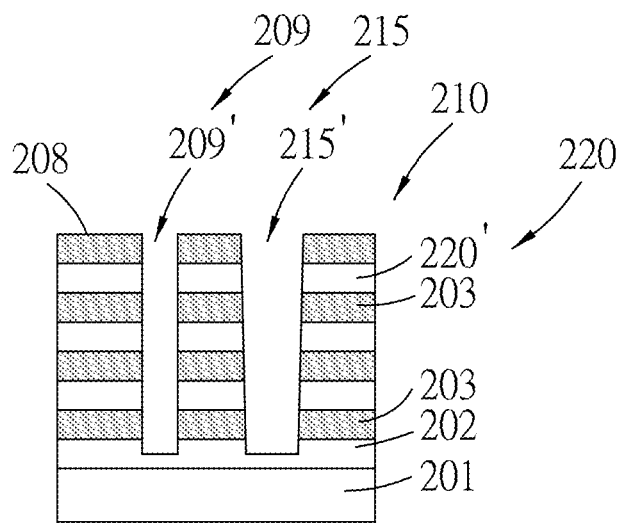
Figure 50:
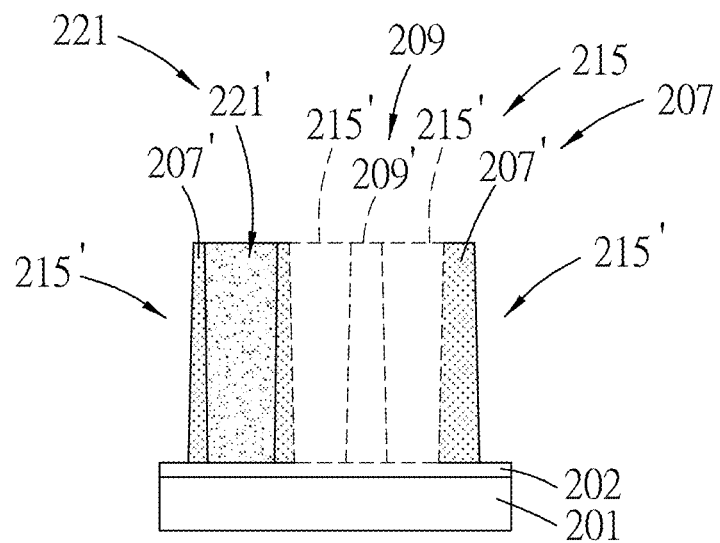

Referring to FIG. 1, the method 100 then proceeds to block 126, where the first and second sacrificial features are removed. FIGS. 47 to 50 schematically illustrate the step of block 126 of the method 100 in FIG. 1, where FIG. 47 is a schematic perspective view of the device, and FIGS. 48 to 50 are schematic sectional views of the device respectively taken from lines 48-48, 49-49 and 50-50 of FIG. 47. In some embodiments, the first sacrificial segments 214' of the first sacrificial feature 214 and the second sacrificial segments 217' of the second sacrificial feature 217 (see FIGS. 43 to 46) are removed using a suitable technique (such as wet etching, dry etching (e.g., atomic layer etching or the like), a combination thereof, or the like) to expose the channel trenches 209' of the channel trench structure 209 and the source/drain trenches 215' of the source/drain trench structure 215, while leaving the dielectric layers 203, the isolation feature 207 and the conductive layers 220' of the conductive structure 220 substantially etched or slightly etched. In some embodiments, a maximum width of each of the source/drain trenches 215' in the X direction may be at least 10 nm greater than a maximum width of each of the channel trenches 209' in the X direction.

Figure 51:
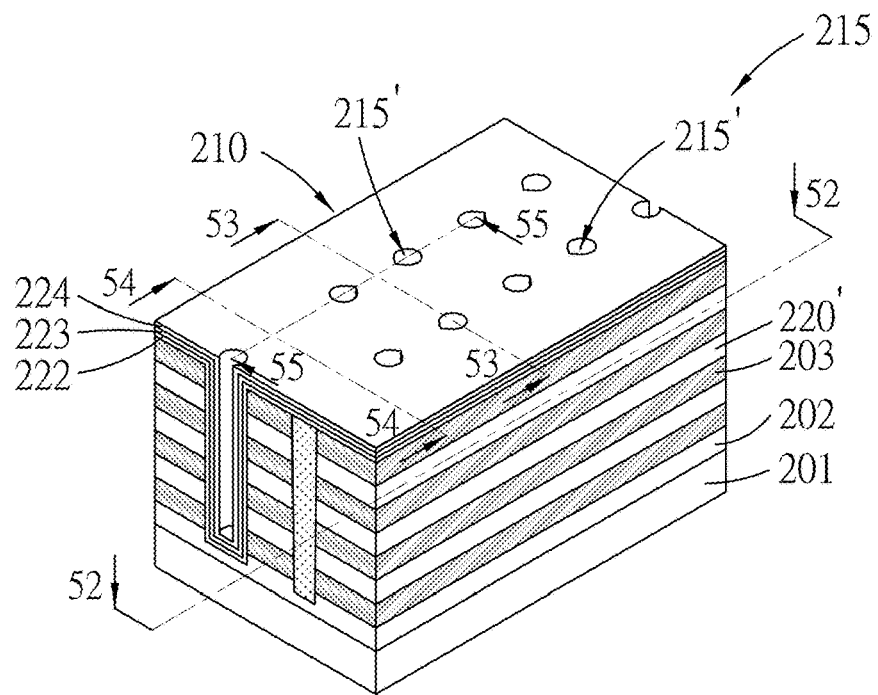
Figure 52:
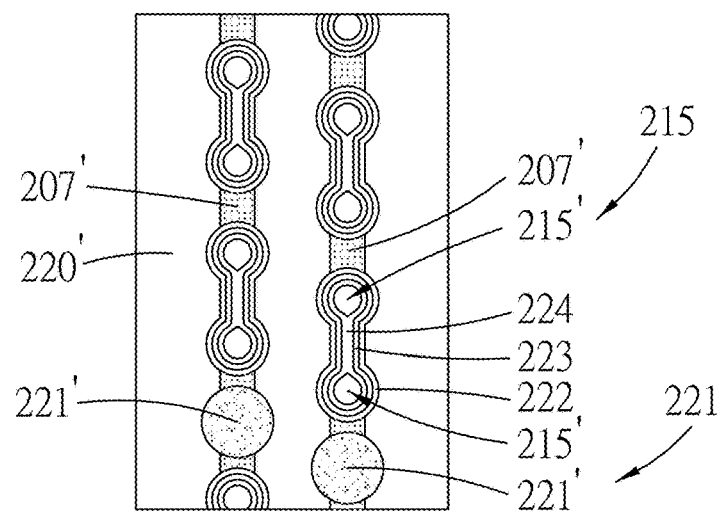
Figure 53:
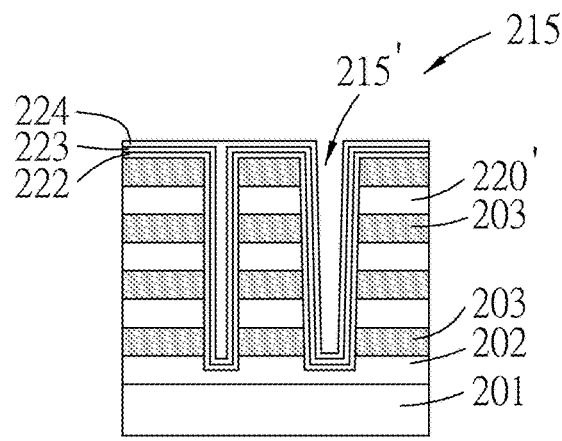
Figure 54:
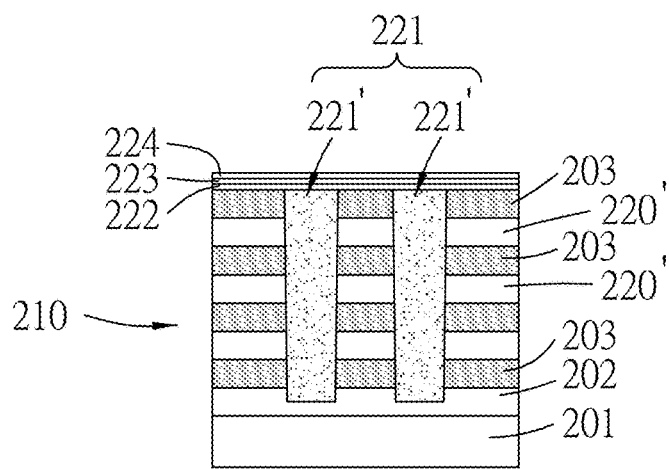

Referring to FIG. 1, the method 100 then proceeds to block 128, where a memory layer, a channel layer and a separation feature are formed. FIGS. 51 to 55 schematically illustrate the step of block 128 of the method 100 in FIG. 1, where FIG. 51 is a schematic perspective view of the device, and FIGS. 52 to 55 are schematic sectional views of the device respectively taken from lines 52-52, 53-53, 54-54 and 55-55 of FIG. 51. In some embodiments, the memory layer 222 is first formed in the channel trenches 209' of the channel trench structure 209 ((see FIGS. 47 to 50)), in the source/drain trenches 215' of the source/drain trench structure 215, and on the top surface 208 of the stack structure 210 (see FIGS. 47 and 49). Then, the channel layer 223 is formed on the memory layer 222. Afterward, the separation feature 224 is formed on the channel layer 223. Referring to FIGS. 48 and 52, in some embodiments, since the maximum of each of the source/drain trenches 215' in the X direction is at least 10 nm greater than the maximum width of each of the channel trenches 209' in the X direction, the separation feature 224 completely fills the channel trenches 209' of the channel trench structure 209, while only partially fills the source/drain trenches 215' of the source/drain trench structure 215. If the maximum of each of the source/drain trenches 215' in the X direction is not at least 10 nm greater than the maximum width of each of the channel trenches 209' in the X direction, both the channel trenches 209' and the source/drain trenches 215' may be completely filled by the separation feature 224 or source/drain trenches 215' may be largely filled by the separation feature 224, leaving little or no room for forming the conductive feature 226 (see FIGS. 61, 62, 63 and 65). Each of the memory layer 222, the channel layer 223 and the separation feature 224 may be formed using a suitable technique, such as ALD, CVD, a combination thereof, or the like. Each of the memory layer 222 and the channel layer 223 may have a suitable thickness ranging from about 3 nm to about 100 nm, but other range values are also within the scope of this disclosure. In some embodiments, the separation feature 224 is deposited until the channel trenches 209' of the channel trench structure 209 are completely filled with the separation feature 224. In some embodiments, the memory layer 222 may be a ferroelectric layer that is made of a suitable material, such as HZO (hafnium-zirconium oxide), or that includes GaN. In some embodiments, the memory layer 222 may be a charge trapping layer such as an ONO (oxide-nitride-oxide) trilayer or the like. In some embodiments, the memory layer 222 may be a floating layer including an interfacial sublayer (IL) 222' connected to the channel layer 223, and a floating sublayer 222" connected to the interfacial sublayer 222' opposite to the channel layer 223. The interfacial sublayer 222' may be made of a suitable material, such as oxide-based material, high dielectric (high-k) material, a combination thereof, or the like. The floating sublayer 222" may be made of a suitable material, such as silicon or the like. In some embodiments, the channel layer 223 may be made of a suitable material, such as element semiconductor, oxide semiconductor, compound semiconductor (including group III-V semiconductors, group II-VI semiconductors, or the like), IgZO, ZnO, any combination thereof, or the like. In some embodiments, the separation feature 224 may be made of a suitable material, such as SiOx, SiCN, SiOC, any combination thereof, or the like.

Figure 56:
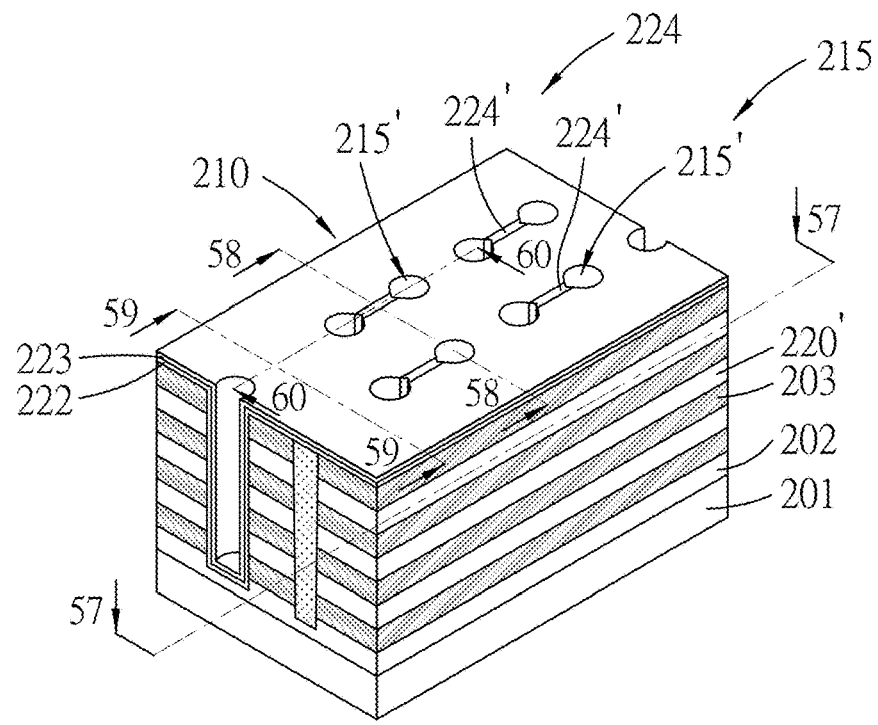
Figure 57:
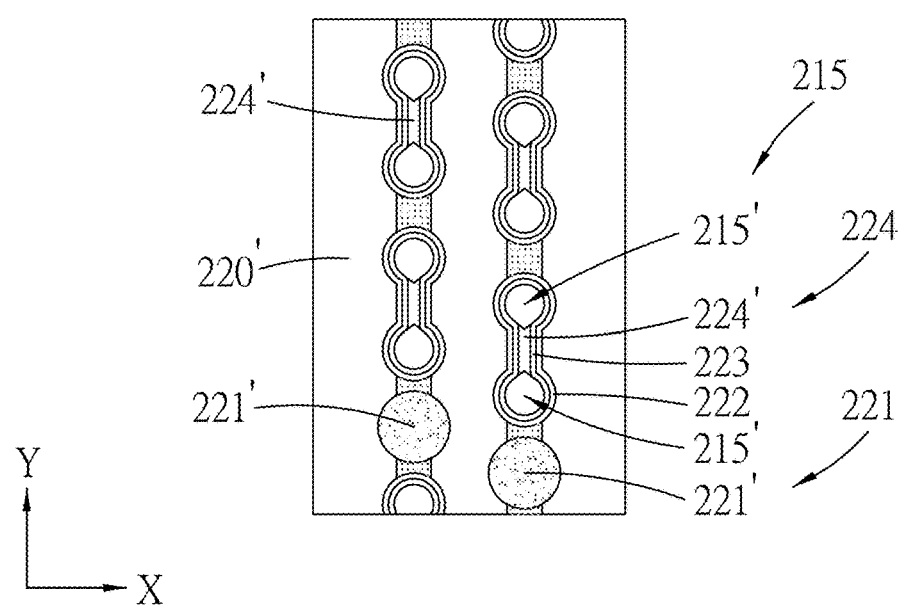
Figure 58:
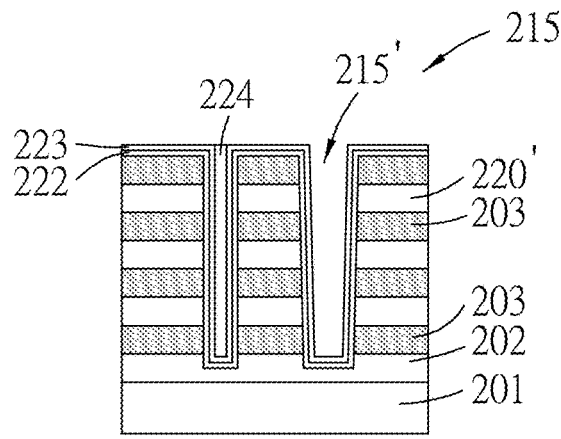
Figure 59:
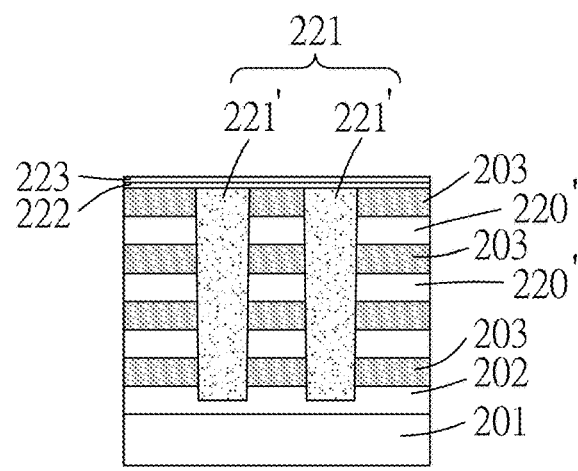
Figure 60:
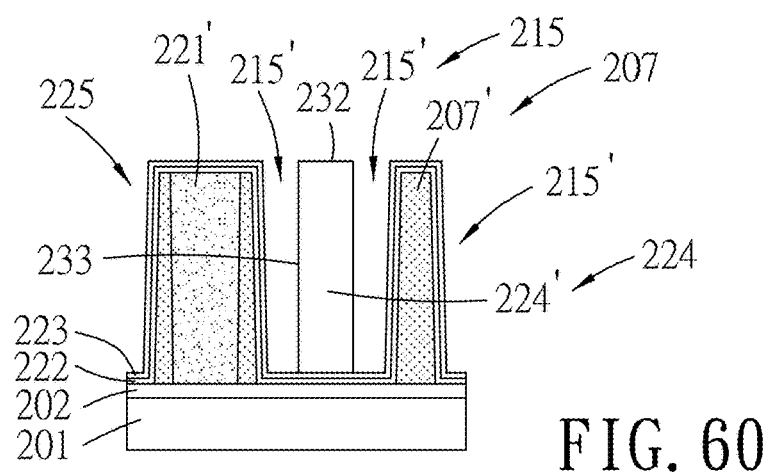

Referring to FIG. 1, the method 100 then proceeds to block 130, where the separation feature is etched. FIGS. 56 to 60 schematically illustrate the step of block 130 of the method 100 in FIG. 1, where FIG. 56 is a schematic perspective view of the device, and FIGS. 57 to 60 are schematic sectional views of the device respectively taken from lines 57-57, 58-58, 59-59 and 60-60 of FIG. 56. In some embodiments, the separation feature 224 is etched (also known as pull back) to remove the separation feature 224 on to the top surface 208 of the stack structure 210 (see FIGS. 47 and 49) and to remove the separation feature 224 in the source/drain trenches 215' of the source/drain trench structure 215 (i.e., only the memory layer 222 and the channel layer 223 remain in the source/drain trenches 215'), thereby forming a plurality of separation segments 224' respectively filling the channel trenches 209' of the channel trench structure 209 (see FIGS. 47 to 50). In some embodiments, a width of each of the separation segments 224' in the X direction may range from about 10 nm to about 100 nm, but other range values are also within the scope of this disclosure. In some embodiments, during the etching of the separation feature 224, a top surface 232 and a lateral surface 233 of each of the separation segments 224' as shown in FIG. 60 may be slightly etched. The etching step may be conducted using a suitable technique, such as wet etching, dry etching (e.g., atomic layer etching or the like), a combination thereof, or the like.

Referring to FIG. 1, the method 100 then proceeds to block 132, where the conductive feature is formed. FIGS. 61 to 65 schematically illustrate the step of block 132 of the method 100 in FIG. 1, where FIG. 61 is a schematic perspective view of the device, and FIGS. 62 to 65 are schematic sectional views of the device respectively taken from lines 62-62, 63-63, 64-64 and 65-65 of FIG. 61. In this step, a suitable conductive material, such as polysilicon (doped or undoped), silicide (TiSi, CoSi, SiGe or the like), oxide semiconductor (InZnO, InGaZnO or the like), metal (Al, Cu, W, Ti, Co, Ni, Ru, TiN, TaN, TaAlN or the like), any combination thereof, or the like, may be deposited to fill the source/drain trenches 215' of the source/drain trench structure 215 (see FIGS. 56, 57, 58 and 60) and may also be deposited on the top surface 208 of the stack structure 210 using a suitable technique (e.g., CVD, ALD, electroplating, electroless plating, any combination thereof, or the like). Afterward, a suitable technique (e.g., CMP, etch back, a combination thereof, or the like) may be conducted to remove the conductive material deposited on the top surface 208 of the stack structure 210, and to remove the memory layer 222 and the channel layer 223 on the top surface 208 (see FIGS. 51 to 55), thereby forming the conductive feature 226 which includes a plurality of conductive segments 226' respectively filling the source/drain trenches 215' of the source/drain trench structure 215 (see FIGS. 56, 57, 58 and 60) and being electrically connected to the conductive layers 220' of the conductive feature 220, a plurality of channel segments 237 each being connected to a respective one of the separation segments 224' and corresponding two of the conductive segments 226', and a plurality of memory segments 236 each being connected between a respective one of the channel segments 237 and the stack structure 210. The semiconductor memory device 250 is thus obtained. In some embodiments, the top surface 232 of each of the separation segments 224' of the separation feature 224 may be etched by such removing step. In some embodiments, the step of removing the material on the top surface 208 of the stack structure 210 may partially remove the top dielectric layer 203; and in other embodiments, such removing step may not etch the dielectric layer 203. In some embodiments, the conductive segments 226' of the conductive feature 226 and the conductive layers 220' of the conductive structure 220 may be made of the same materials; in other embodiments, the conductive segments 226' of the conductive feature 226 and the conductive layers 220' of the conductive structure 220 may be made of different materials.

Referring to FIGS. 61 to 65, in some embodiments, the semiconductor memory device 250 includes a plurality of memory cell structures 410 that are disposed in the stack structure 210, and that are separated from each other by the dielectric isolation segments 207'. Each of the memory cell structures 410 includes a pair of two of the conductive segments 226' which are separated by a corresponding one of the dielectric separation segments 224' in the Y direction and which are substantially aligned in the Y direction. Each of the memory cell structures 410 further includes a corresponding one of the conductive channel segments 237 that encloses side surfaces of the conductive segments 226' and the dielectric separation segments 224', and a corresponding one of the memory segments 236 that encloses side surface of the corresponding conductive channel segment 237 and that is connected between the stack structure 210 and the corresponding conductive channel segment 237. In some embodiments, for each of the memory cell structures 410, a maximum width of each of the conductive segments 226' in the X direction is at least 10 nm greater than a maximum width of the dielectric separation segment 224' in the X direction, which may be the result of having the maximum width of each of the source/drain trenches 215' (see FIG. 48) in the X direction to be at least 10 nm greater than the maximum width of each of the channel trenches 209' (see FIG. 48) in the X direction. In some embodiments, the memory cell structures 410 are arranged into two groups that are separated in the X direction. For each group, the memory cell structures 410 are substantially aligned in the Y direction. Each of the memory cell structures 410 in one group may be misaligned with a corresponding one of the memory cell structures 410 in the other group in the X direction.

Figure 62:
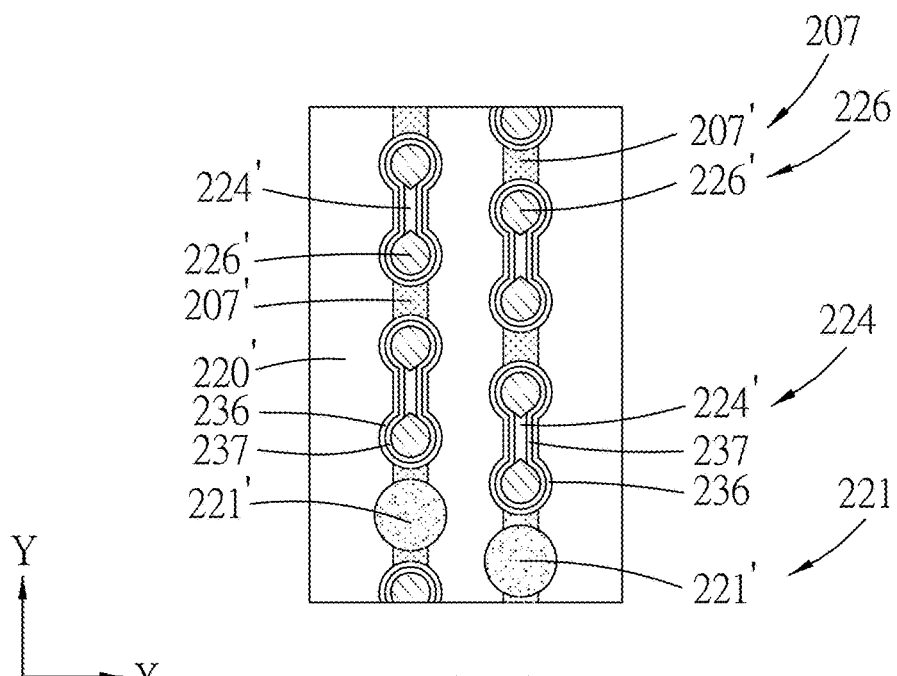
Figure 63:
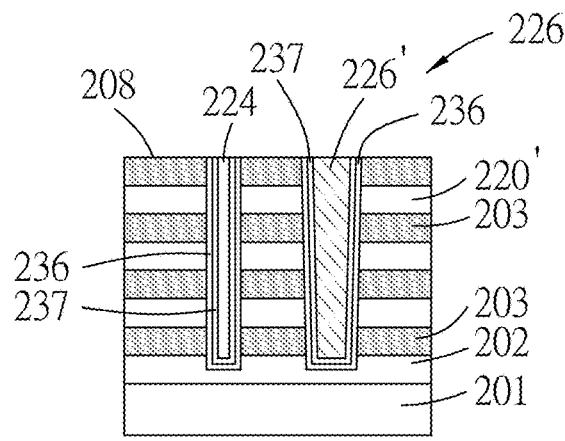
Figure 64:
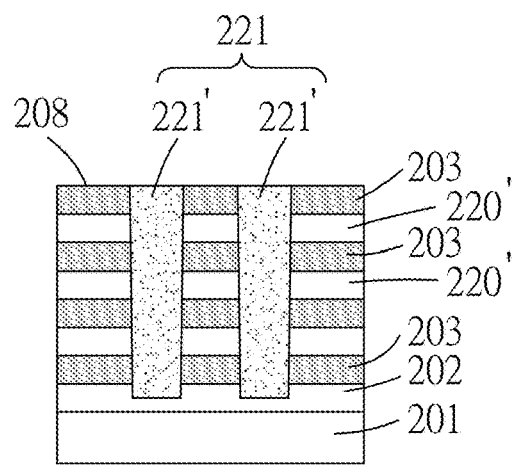
Figure 65:
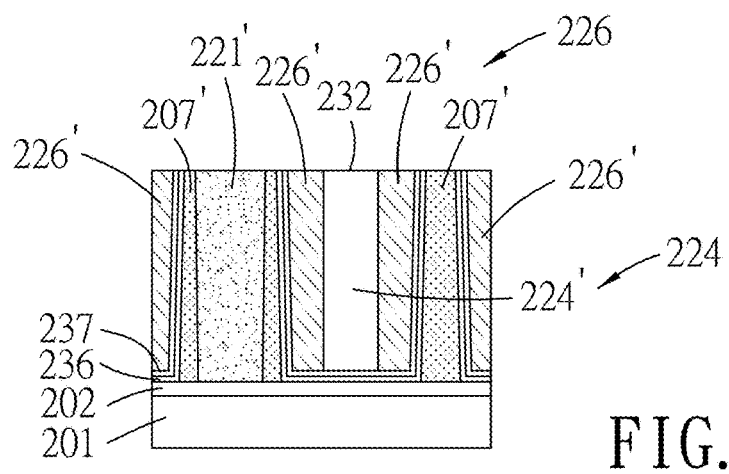
Figure 66:
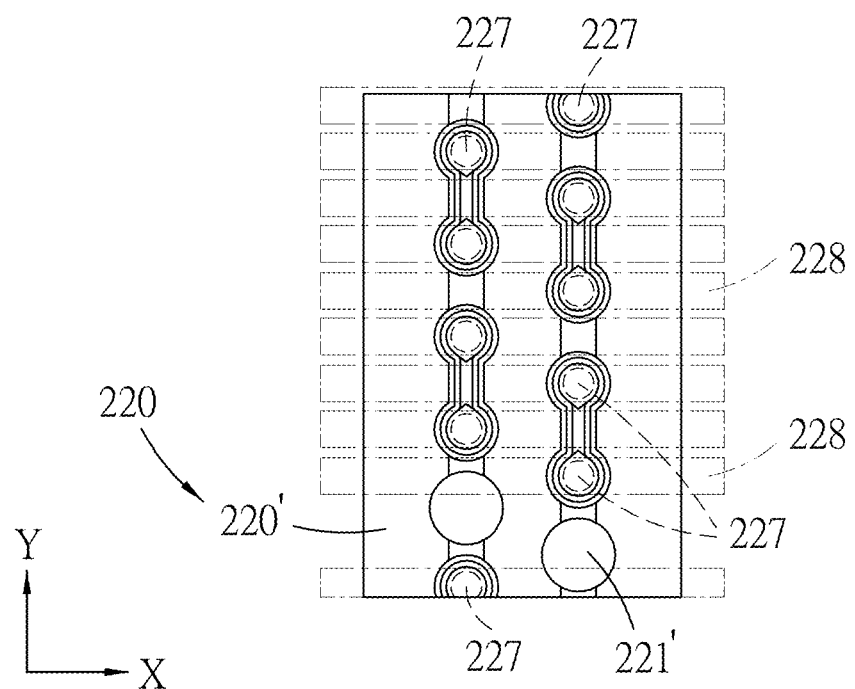
FIGS. 66 to 68 are schematic views showing a plurality of vias and a plurality of connection wires connected to the semiconductor memory device in accordance with some embodiments.
Figure 67:
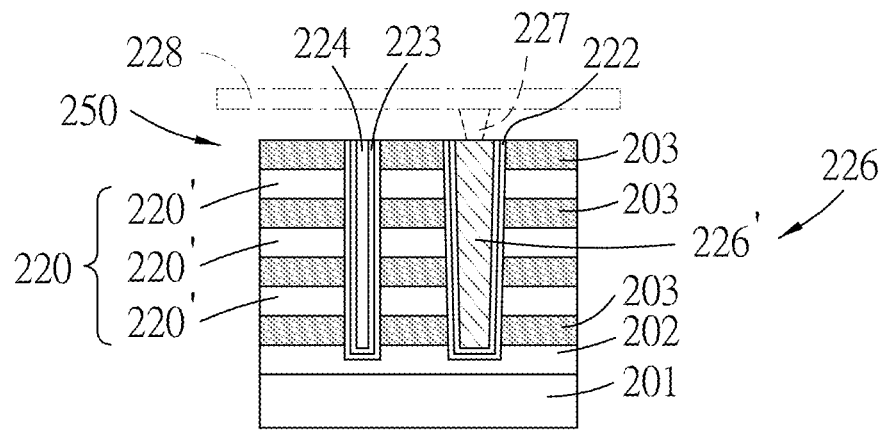
Figure 68:
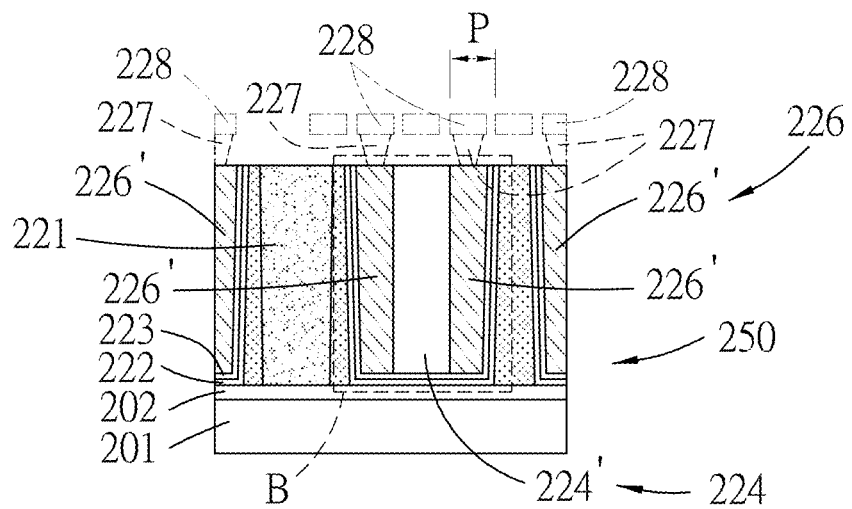

Referring to FIGS. 66 to 68, after the semiconductor memory device 250 is obtained, the connection wires 228 may be formed to be respectively and electrically connected to the conductive segments 226' of the conductive feature 226. In some embodiments, a plurality of vias 227 may be formed so that each of the vias 227 electrically interconnects a respective one of the connection wires 228 to a respective one of the conductive segments 226'. The structure of the semiconductor memory device 250 shown in FIG. 66 is similar to that shown in FIG. 62, but the semiconductor memory device 250 shown in FIG. 66 further includes multiple vias 227 and multiple connection wires 228. The structure of the semiconductor memory device 250 shown in FIG. 67 is similar to that shown in FIG. 63, but the semiconductor memory device 250 shown in FIG. 67 further includes one of the vias 227 and a respective connection wire 228. The structure of the semiconductor memory device 250 shown in FIG. 68 is similar to that shown in FIG. 65, but the semiconductor memory device 250 shown in FIG. 68 further includes multiple vias 227 and multiple connection wires 228. In some embodiments, the vias 227 and the connection wires 228 may be formed in at least one layer of dielectric material (not shown) disposed on the semiconductor memory device 250 using a suitable technique, such as a damascene process, and may be made of a suitable conductive material, such as Cu, W, Co, Al, any combination thereof, or the like. In some embodiments, as shown in FIG. 68, a minimum pitch (P) between adjacent two of the connection wires 228 may be about 40 nm. In other embodiments, the minimum pitch (P) may range from about 30 nm to about 500 nm, but other range values are also within the scope of this disclosure. Referring to FIGS. 62 and 66, in some embodiments, since the conductive segments 226' are misaligned in the Y direction, the connection wires 228, which are respectively disposed above and connected to the conductive segments 226', can be densely arranged along the Y direction. In other embodiments, the conductive segments 226' may not be misaligned in the Y direction, and the arrangement of the connection wires 228 may be changed such that the connection wires 228 may still be arranged closely. For example, the connection wires 228 may be arranged into two groups, in which the connection wires 228 of one group can be respectively and electrically connected to the conductive segments 226' in the right row as shown in FIG. 62, and can extend to the right side of FIG.

62; and the connection wires 228 of another group can be respectively and electrically connected to the conductive segments 226' in the left row as shown in FIG. 62, and can extend to the left side of FIG. 62. Referring to FIGS. 66 and 67, in a non-limiting example, each of the conductive layers 220' of the conductive structure 220 may be electrically connected to an external power supply (not shown) at the top or bottom side of FIG. 66.

Referring to FIGS. 67 and 68, in some embodiments, the block (B) may represent a plurality of memory cells (not shown), each being controlled by a respective one of the conductive layers 220' of the conductive structure 220 (also known as gate or word line (WL)). One of the conductive segments 226' enclosed by the block (B) may be the source of each of the memory cells, and the other one of the conductive segments 226' enclosed by the block (B) may be the drain of each of the memory cells. In this embodiment, the memory cells are connected in parallel to obtain a 3D NOR-type memory architecture, but other suitable arrangements are also within the scope of this disclosure.

Figure 69:
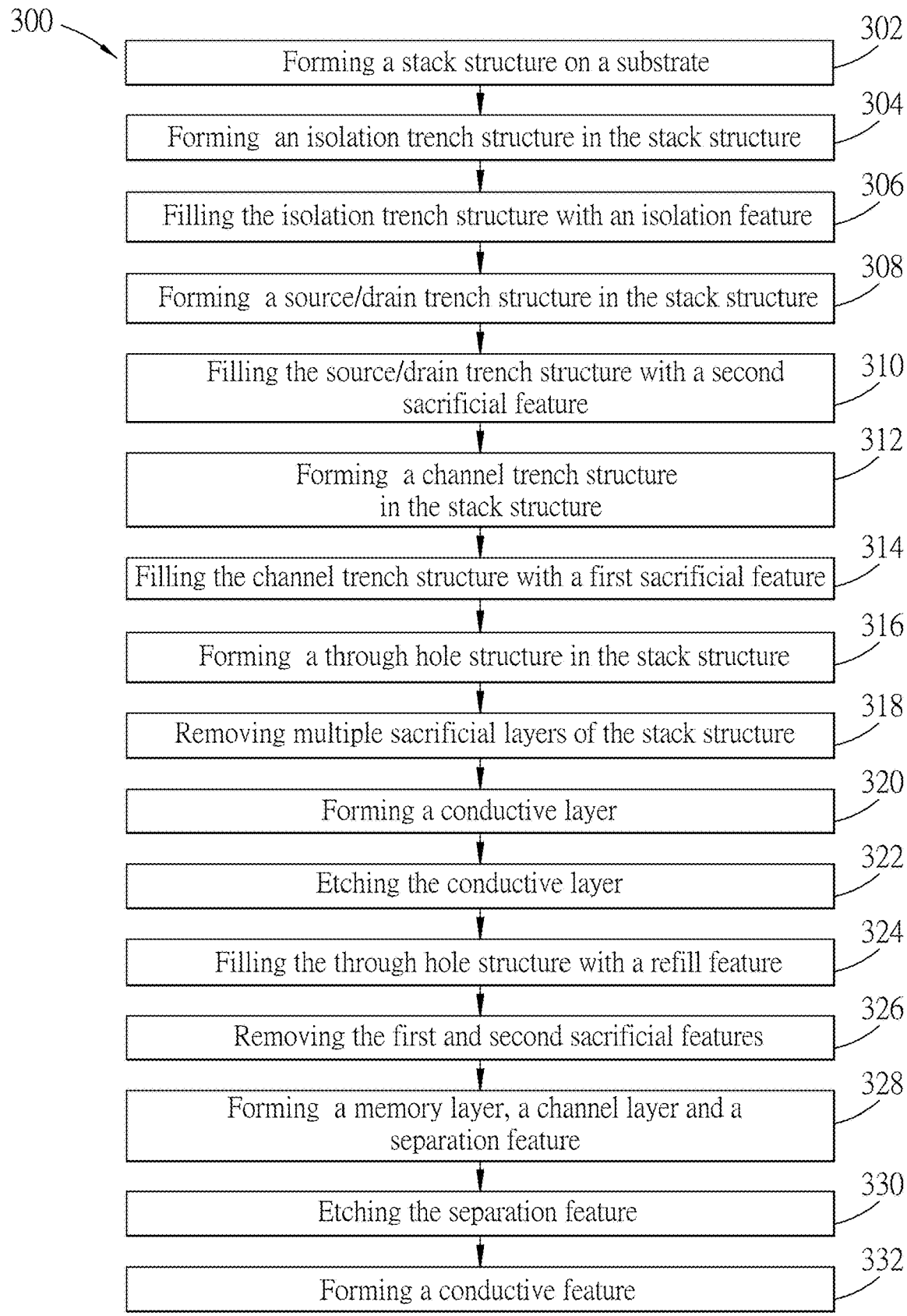
FIG. 69 is a flow chart illustrating another method for manufacturing a semiconductor memory device in accordance with some embodiments.

FIG. 69 illustrates a method 300 for manufacturing the semiconductor memory device 250 (see FIG. 61) in accordance with some embodiments. Additional steps which are not limited to those described in the method 300, can be provided before, after or during the manufacturing of the semiconductor memory 250, and some of the steps described herein may be replaced by other steps or be eliminated. Similarly, additional features may be present in the semiconductor memory device 250, and/or features present may be replaced or eliminated in additional embodiments.

Referring to FIG. 69, the method 300 begins at block 302 and proceeds sequentially to block 332. The steps illustrated by blocks 302 to 306 are substantially identical to those of blocks 102 to 106 of FIG. 1 (but suitable changes may be made to each of the steps of blocks 302 to 306), and are therefore not further described for the sake of brevity.

Figure 70:
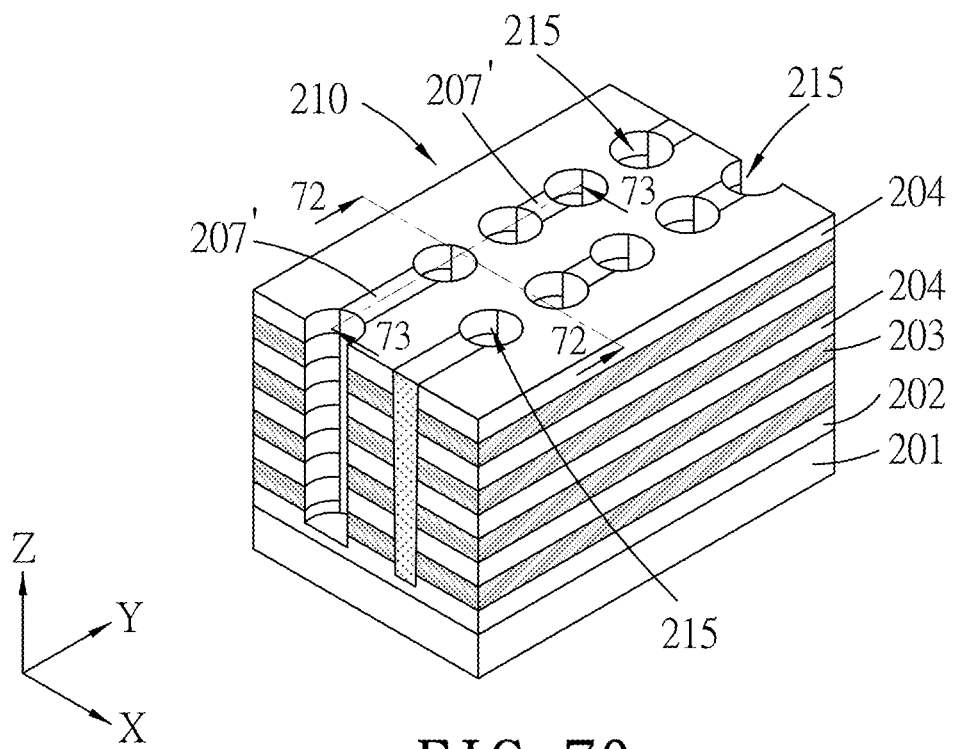
FIGS. 70 to 81 illustrate intermediate stages of the method as depicted in FIG. 69.
Figure 71:
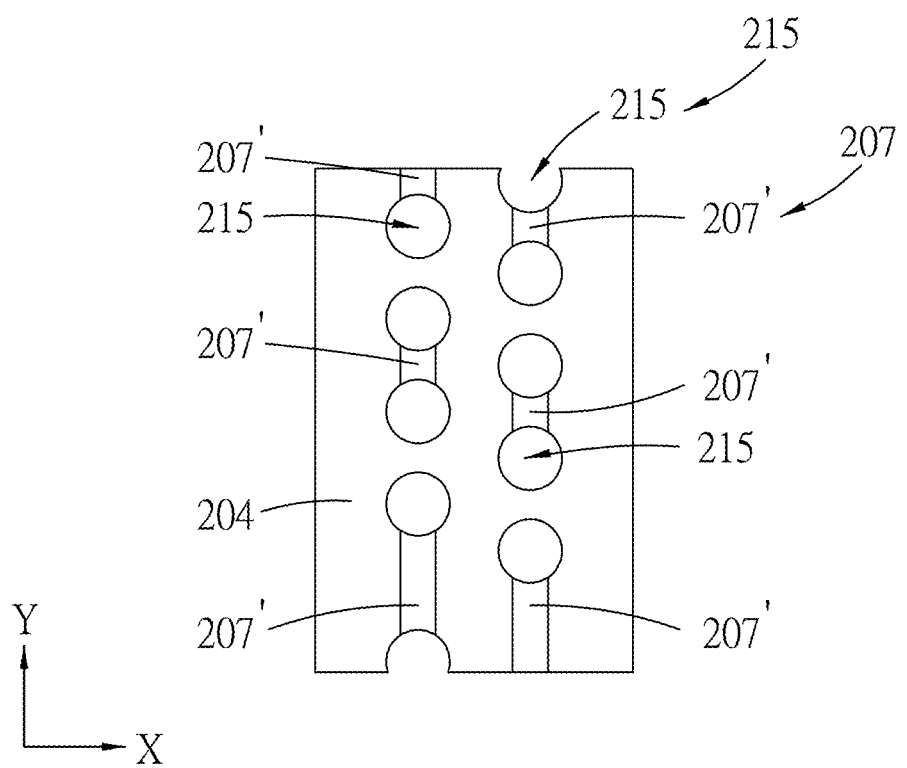
Figure 72:
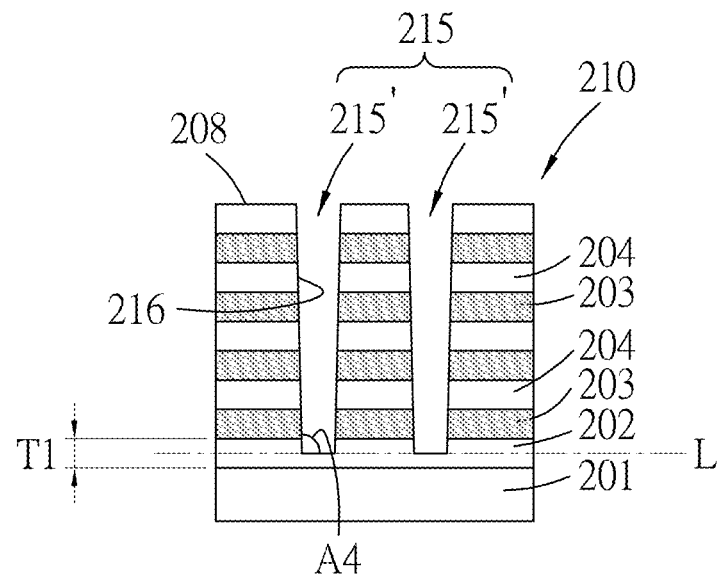
Figure 73:
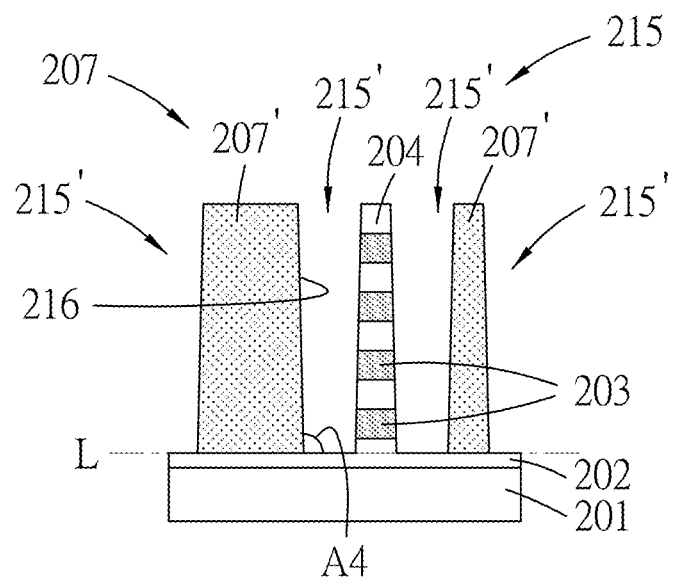

Referring to FIG. 69, after the step illustrated in block 306, the method 300 then proceeds to block 308, where the source/drain trench structure is formed in the stack structure. FIGS. 70 to 73 schematically illustrate the step of block 308 of the method 300 in FIG. 69, where FIG. 70 is a schematic perspective view of the device, FIG. 71 is a schematic top view of the device, and FIGS. 72 and 73 are schematic sectional views of the device respectively taken from lines 72-72 and 73-73 of FIG. 70. In some embodiments, the stack structure 210 and the isolation feature 207 may be etched to form the source/drain trench structure 215 which may include a plurality of the source/drain trenches 215'. As shown in FIGS. 70 and 71, each of the source/drain trenches 215' may be formed by etching the stack structure 210 and a portion of a corresponding one of the isolation segments 207' of the isolation feature 207, and may be disposed in pairs with the source/drain trenches 215' of each pair being respectively located at opposite ends of the corresponding etched isolation segment 207' in the Y direction. In some embodiments, each of the source/drain trenches 215' may be slightly misaligned with the corresponding etched isolation segment 207' in the Y direction. In this embodiment, as shown in FIGS. 70 and 71, each of the source/drain trenches 215' is substantially circular when viewed from above, but, in other embodiments, each of the source/drain trenches 215' may be oval, rectangular or have other suitable shapes when viewed from above. Referring to FIG. 71, in some embodiments, a maximum width of each of the source/drain trenches 215' in the X direction may be greater than the width of the corresponding etched isolation segment 207' in the X direction. The stack structure 210 and the isolation feature 207 may be etched using a suitable technique, such as an anisotropic dry etch or the like, with a suitable etchant, such as $CF_4$, $CHF_3$, $CH_2F_2$, Ar, $N_2$, $O_2$, He, any combination thereof, or the like. Each of the source/drain trenches 215' may penetrate the stack structure 210 and the isolation feature 207, and may terminate at the etch stop layer 202. In a non-limiting example, the etch stop layer 202 is etched away to about half of the thickness (T1) during the formation of the source/drain trenches 215'. In some embodiments, each of the source/drain trenches 215' may be defined by the fourth inner wall 216 which is defined by the stack structure 210 and the isolation feature 207, and the fourth inner wall 216 may form the fourth included angle (A4) with the imaginary plane (L) that is parallel to the Y-X plane, as shown in FIGS. 70, 72 and 73. The fourth included angle (A4) may range from about 90° to about 92°, but other range values are also within the scope of this disclosure.

Figure 74:
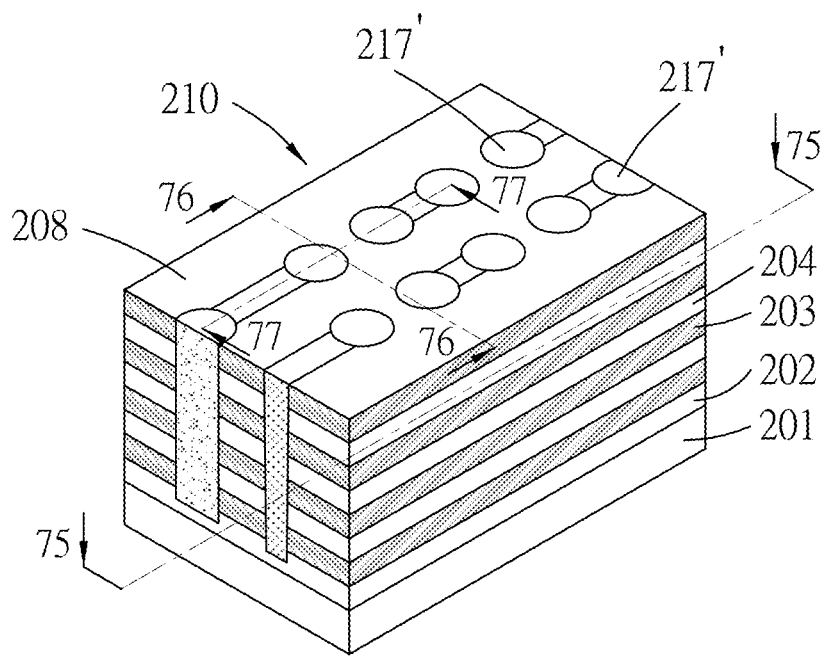
Figure 75:
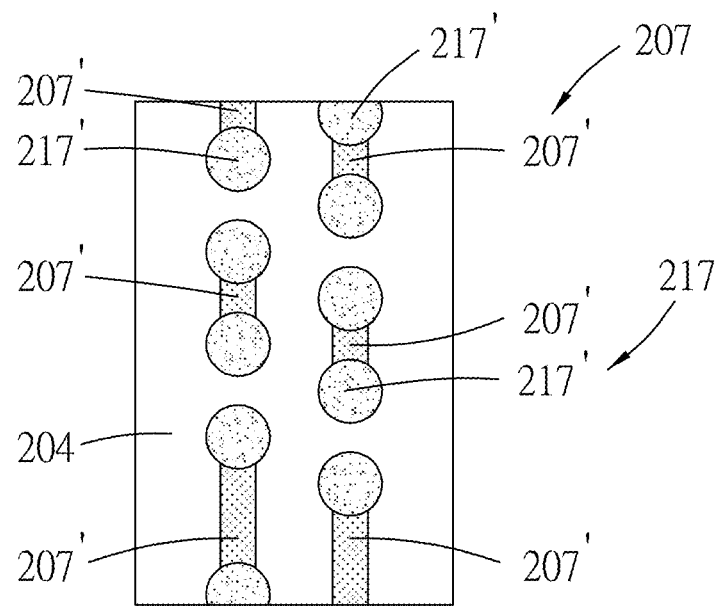
Figure 76:
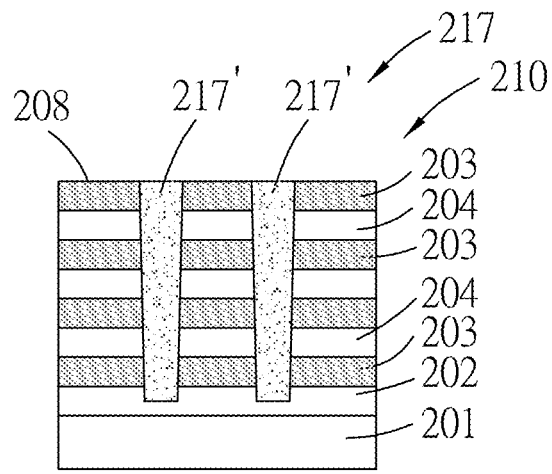
Figure 77:
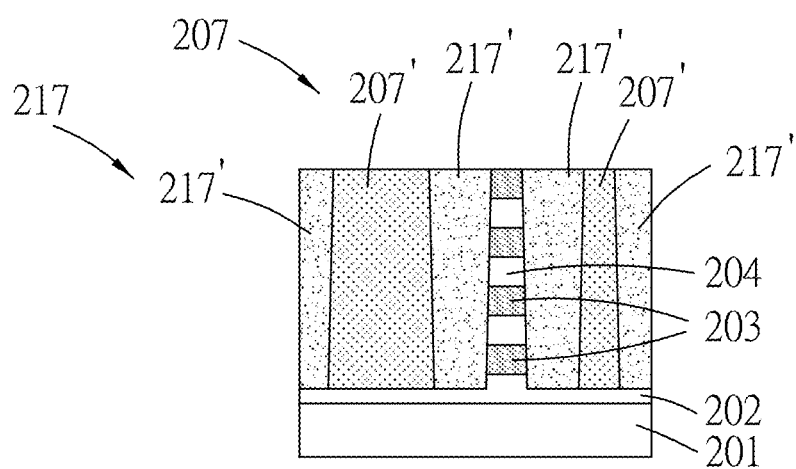

Referring to FIG. 69, the method 300 then proceeds to block 310, where the source/drain trench structure is filled with the second sacrificial feature. FIGS. 74 to 77 schematically illustrate the step of block 310 of the method 300 in FIG. 69, where FIG. 74 is a schematic perspective view of the device, and FIGS. 75 to 77 are schematic sectional views of the device respectively taken from lines 75-75, 76-76 and 77-77 of FIG. 74. In this step, a suitable material, such as $Si_3N_4$, amorphous silicon, a combination thereof, or the like, may be deposited to fill the source/drain trenches 215' of the source/drain trench structure 215 (see FIGS. 70 to 73) and may also be deposited on the top surface 208 of the stack structure 210, followed by removing the material on the top surface 208 of the stack structure 210 using a suitable technique, such as CMP, etch back, a combination thereof, or the like, so as to form the second sacrificial feature 217 filling the source/drain trench structure 215 (see FIGS. 70 to 73). In some embodiments, the second sacrificial feature 217 includes a plurality of the second sacrificial segments 217' that respectively fill the source/drain trenches 215' of the source/drain trench structure 215 (see FIGS. 70 to 73). In some embodiments, the step of removing the material on the top surface 208 may also partially remove the top dielectric layer 203; in other embodiments, such removing step may also entirely remove the top dielectric layer 203; and in still other embodiments, such removing step may not etch the top dielectric layer 203.

Figure 78:
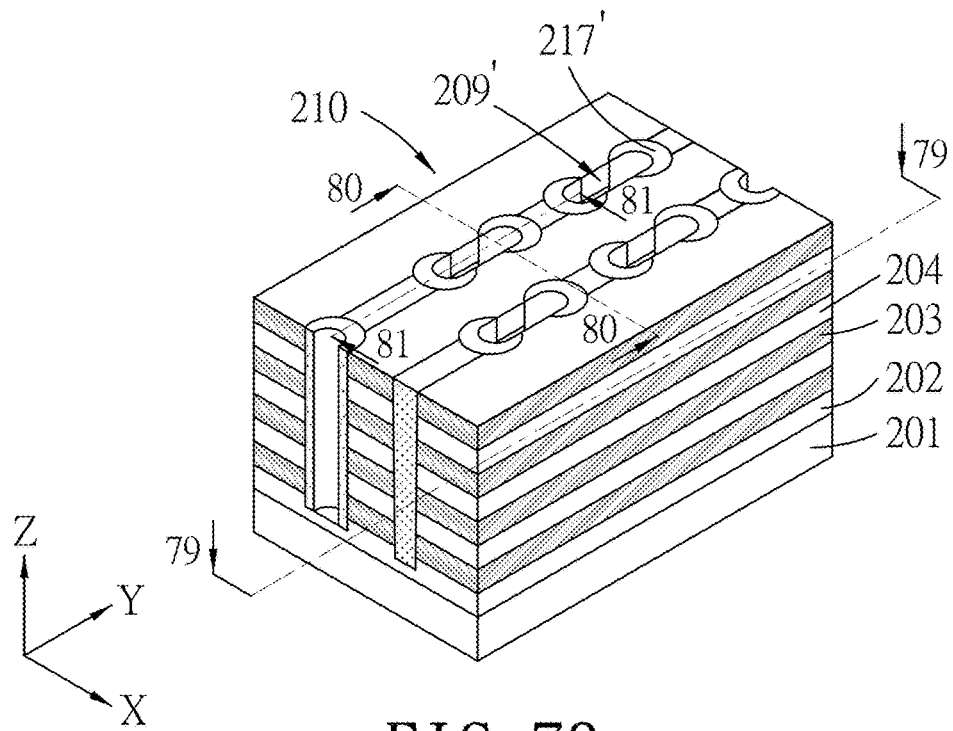
Figure 79:
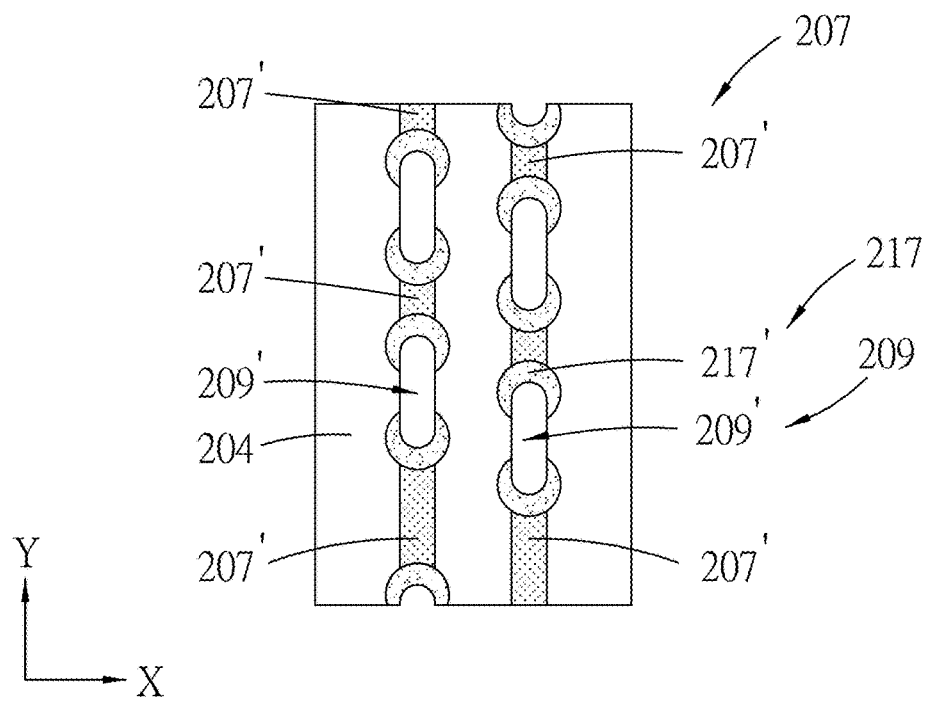
Figure 80:
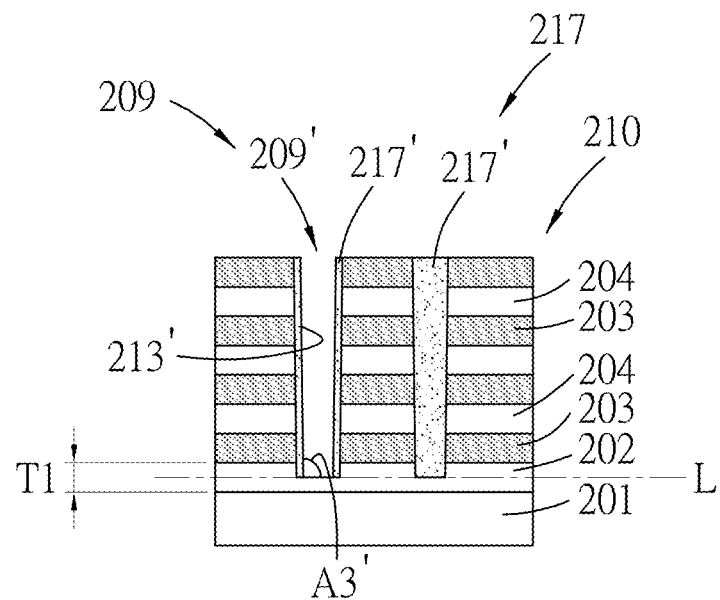
Figure 81:
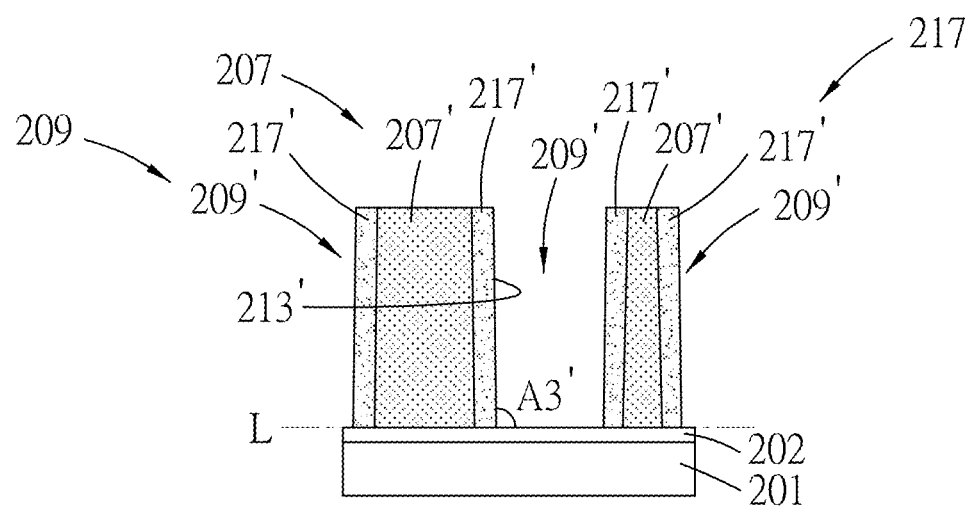

Referring to FIG. 69, the method 300 then proceeds to block 312, where the channel trench structure is formed in the stack structure. FIGS. 78 to 81 schematically illustrate the step of block 312 of the method 300 in FIG. 69, where FIG. 78 is a schematic perspective view of the device, and FIGS. 79 to 81 are schematic sectional views of the device respectively taken from lines 79-79, 80-80 and 81-81 of FIG. 78. In some embodiments, the stack structure 210 and the second sacrificial feature 217 may be etched to form the channel trench structure 209 which may include a plurality of the channel trenches 209'. As shown in FIGS. 78 and 79, each of the channel trenches 209' may be disposed between corresponding adjacent two of the second sacrificial segments 217' in the Y direction, such that each of the channel trenches 209' may be disposed between corresponding adjacent two of the isolation segments 207' in the Y direction. In some embodiments, each of the channel trenches 209' may be slightly misaligned with the corresponding adjacent two of the isolation segments 207' and/or the corresponding adjacent two of the second sacrificial segments 217' in the Y direction, and each of the channel trenches 209' may be slightly closer to one of the corresponding adjacent two of the isolation segments 207'. Referring to FIG. 79, in some embodiments, each of the channel trenches 209' may have a width in the X direction not smaller than about 10 nm. In some embodiments, the length of each of the channel trenches 209' in the Y direction may be greater than the width of the channel trench 209' in the X direction, and each of the length and width of the channel trench 209' may range from about 10 nm to about 500 nm, but other range vales are also within the scope of this disclosure. Each of the channel trenches 209' may be formed by etching the stack structure 210 and the second sacrificial feature 217 using a suitable technique, such as anisotropic dry etch or the like, with a suitable etchant, such as $CF_4$, $CHF_3$, $CH_2F_2$, Ar, $N_2$, $O_2$, He, any combination thereof, or the like. Each of the channel trenches 209' may penetrate the stack structure 210 and the second sacrificial feature 217, and may terminate at the etch stop layer 202. In a non-limiting example, the etch stop layer 202 is etched away to about half of the thickness (T1) during the formation of the channel trenches 209'. In some embodiments, each of the channel trenches 209' may be defined by a third inner wall 213' which is defined by the stack structure 210 and the second sacrificial feature 217. The third inner wall 213' may form a third included angle (A3') with the imaginary plane (L) that is parallel to the Y-X plane, as shown in FIGS. 78, 80 and 81. The third included angle (A3') may range from about 88° to about 90°, but other range values are also within the scope of this disclosure.

Referring to FIG. 69, the method 300 then proceeds to block 314, where the channel trench structure is filled with the first sacrificial feature. The step of block 314 of FIG. 69 is illustrated in FIGS. 24 to 27, and details thereof are not repeated for the sake of brevity (but suitable changes may be made to the step of blocks 314). After the step of block 314, the method 300 then proceeds to blocks 316 to 332, which are substantially identical to blocks 116 to 132 of the method 100 of FIG. 1 (but suitable changes may be made to each of the steps of blocks 316 to 332). Therefore, details of the blocks 316 to 332 of the method 300 of FIG. 69 are not repeated for the sake of brevity.

Figure 55:
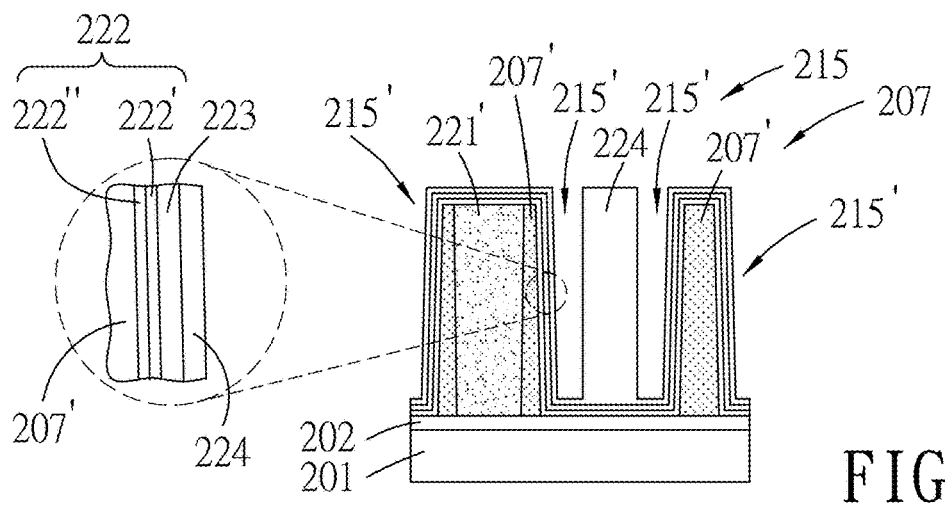
Figure 82:
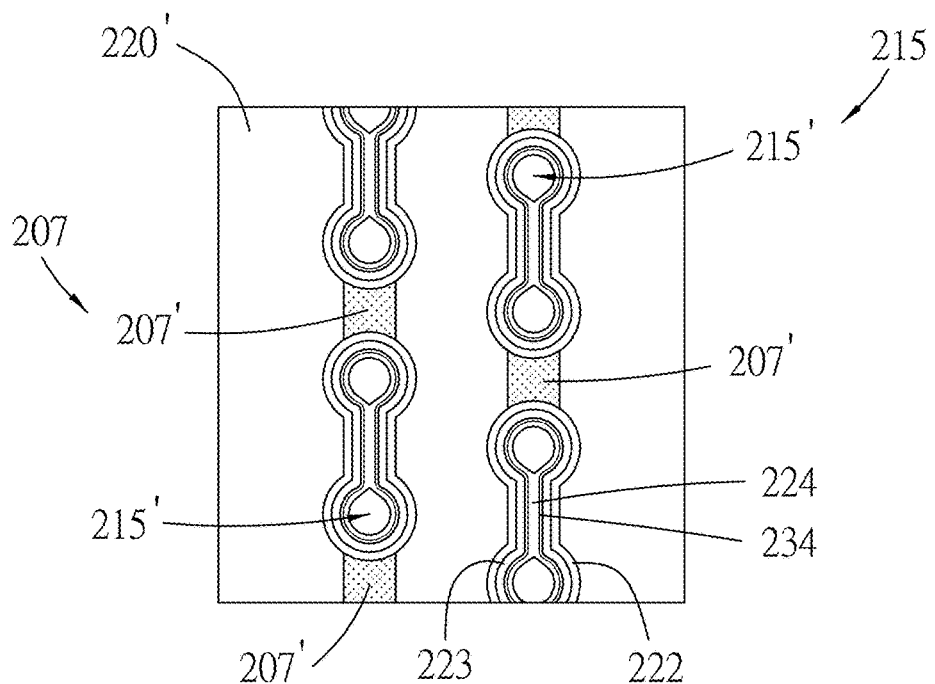
FIGS. 82 to 86 illustrate intermediate stages of yet another method for manufacturing a semiconductor memory device in accordance with some embodiments.

In accordance with some embodiments, the structure of the semiconductor memory device 250 shown in FIG. 82 corresponds to that shown in FIG. 52, but FIG. 82 illustrates that, after the step of block 126 of the method 100 of FIG. 1 (i.e., FIGS. 47 to 50), the memory layer 222, the channel layer 223, a capping layer 234 and the separation feature 224 are sequentially formed. In some embodiments, the memory layer 222 is first formed in the channel trenches 209' of the channel trench structure 209 (see FIGS. 47 to 50), in the source/drain trenches 215' of the source/drain trench structure 215, and on the top surface 208 of the stack structure 210 (see FIGS. 47 and 49). Afterward, the channel layer 223 is formed on the memory layer 222, and then the capping layer 234 is formed on the channel layer 223. Subsequently, the separation feature 224 is formed on the capping layer 234, so as to completely fill the channel trenches 209' of the channel trench structure 209 (see FIGS. 47 to 50), and to partially fill the source/drain trenches 215' of the source/drain trench structure 215. Each of the memory layer 222, the channel layer 223, the capping layer 234 and the separation feature 224 may be formed using a suitable technique, such as ALD, CVD, a combination thereof, or the like. In some embodiments, each of the memory layer 222 and the channel layer 223 may have a suitable thickness ranging from about 3 nm to about 100 nm, but other range values are also within the scope of this disclosure. If the thickness of each of the memory layer 222 and the channel layer 223 is less than about 3 nm, the memory layer 222 and the channel layer 223 may not be able to serve their functions properly. If the thickness of each of the memory layer 222 and the channel layer 223 is greater than about 100 nm, there may not be sufficient room for forming the separation feature 224 and/or the subsequently formed conductive feature 226 (see FIGS. 86 and 87) In some embodiments, the capping layer 234 may have a suitable thickness ranging from about 1 nm to about 20 nm, but other range values are also within the scope of this disclosure. In some embodiments, the separation feature 224 is deposited until the channel trenches 209' of the channel trench structure 209 (see FIGS. 47 to 50) are completely filled with the separation feature 224. In some embodiments, the memory layer 222 may be a ferroelectric layer made of a suitable material, such as HZO (hafnium-zirconium oxide), GaN, a combination thereof, or the like. In some embodiments, the memory layer 222 may be a charge trapping layer, such as a ONO (oxide-nitride-oxide) trilayer or the like. Referring further to FIG. 55, in some embodiments, the memory layer 222 may be a floating layer including an interfacial sublayer (IL) 222' connected to the channel layer 223, and a floating sublayer 222" connected to the interfacial sublayer 222' opposite to the channel layer 223. The interfacial sublayer 222' may be made of a suitable material, such as oxide-based material, high dielectric (high-k) material, a combination thereof, or the like. The floating sublayer 222" may be made of a suitable material, such as silicon or the like. In some embodiments, the channel layer 223 may be made of a suitable material, such as element semiconductor, oxide semiconductor, compound semiconductor (including group III-V, group II-VI semiconductors or the like), IgZO, ZnO, any combination thereof, or the like. In some embodiments, each of the capping layer 234 and the separation feature 224 may be made of a suitable material, such as SiOx, SiCN, SiOC, any combination thereof, or the like. In some embodiments, the capping layer 234 and the separation feature 224 are made of different materials such that the capping layer 234 and the separation feature 224 have high etch selectivity relative to each other. In other words, a suitable etchant may readily etch the separation feature 224 while leaving the capping layer 234 substantially unetched or only slightly etched, and vice versa.

Figure 83:
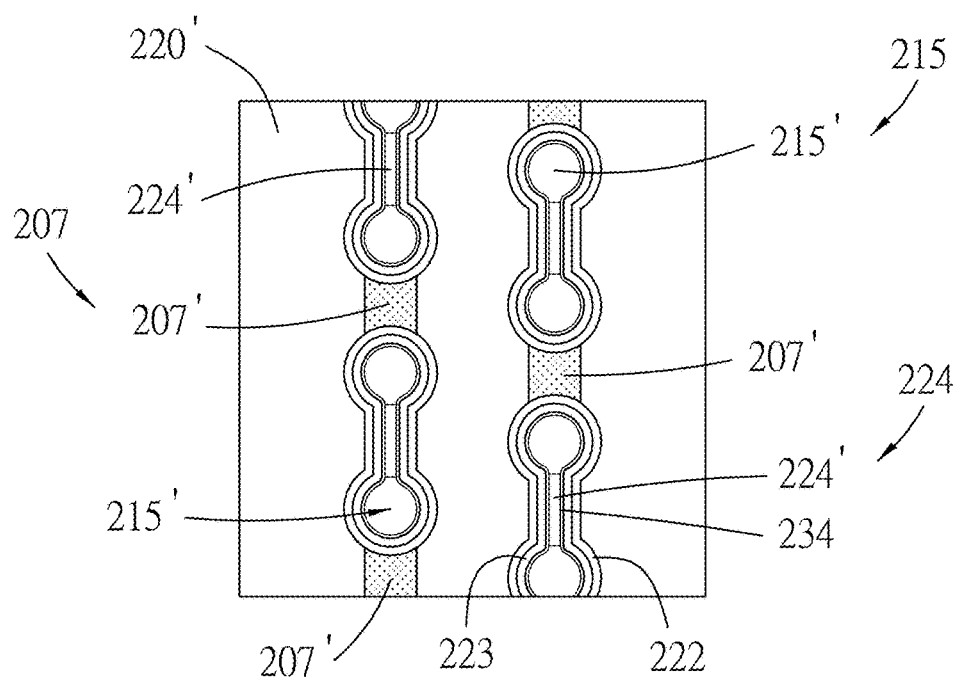

After performing the step to obtain the structure shown in FIG. 82, the step of block 130 of the method 100 in FIG. 1 is performed, resulting in a structure illustrated in FIG. 83. In some embodiments, the separation feature 224 is etched (also known as pull back) to remove the separation feature 224 corresponding to the top surface 208 of the stack structure 210 (see FIGS. 47 and 49) and to remove the separation feature 224 in the source/drain trenches 215' of the source/drain trench structure 215 (i.e., only the memory layer 222, the channel layer 223 and the capping layer 234 remain in the source/drain trenches 215'), thereby forming a plurality of the separation segments 224' respectively filling the channel trenches 209' of the channel trench structure 209 (see FIGS. 47 to 50). In some embodiments, during the etching of the separation feature 224, a top surface 232 and a lateral surface 233 of each of the separation segments 224' as shown in FIG. 60 may be slightly etched. The etching step may be conducted using a suitable technique, such as wet etching, dry etching (e.g., atomic layer etching or the like), a combination thereof, or the like.

Figure 84:
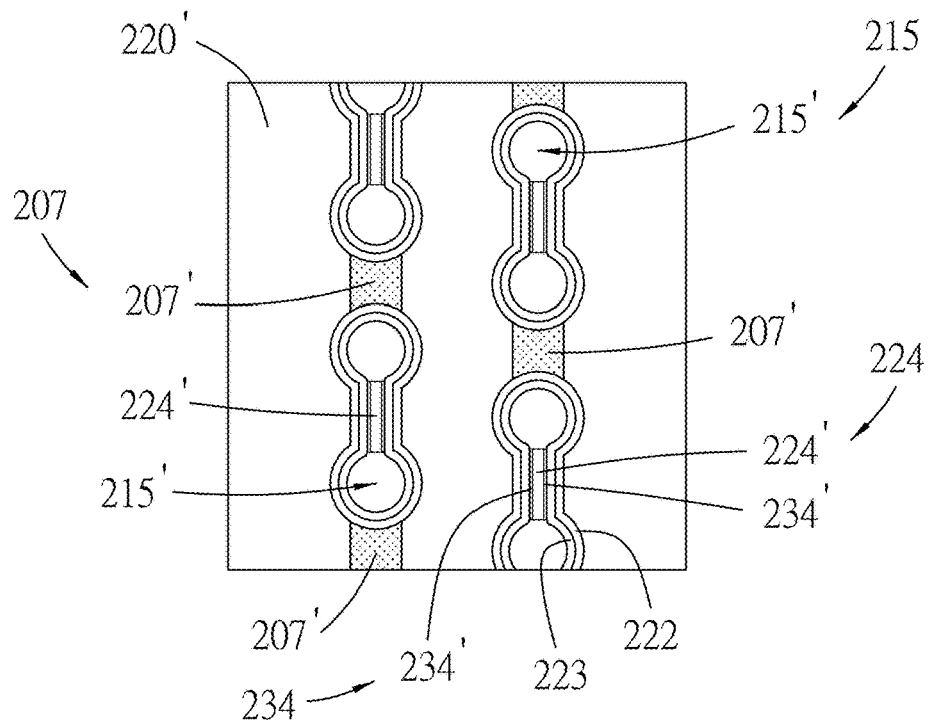

Referring to FIG. 84, after performing the step to obtain the structure as shown in FIG. 83, the capping layer 234 is etched (also known as pull back) to remove the capping layer 234 corresponding to the top surface 208 of the stack structure 210 (see FIGS. 47 and 49) and to remove the capping layer 234 in the source/drain trenches 215' of the source/drain trench structure 215 (i.e., only the memory layer 222 and the channel layer 223 remain in the source/drain trenches 215'), so as to form a plurality of capping segments 234' in the channel trenches 209' of the channel trench structure 209 (see FIGS. 47 to 50). The etching step may be conducted using a suitable technique, such as wet etching, dry etching (e.g., atomic layer etching or the like), a combination thereof, or the like.

Figure 85:
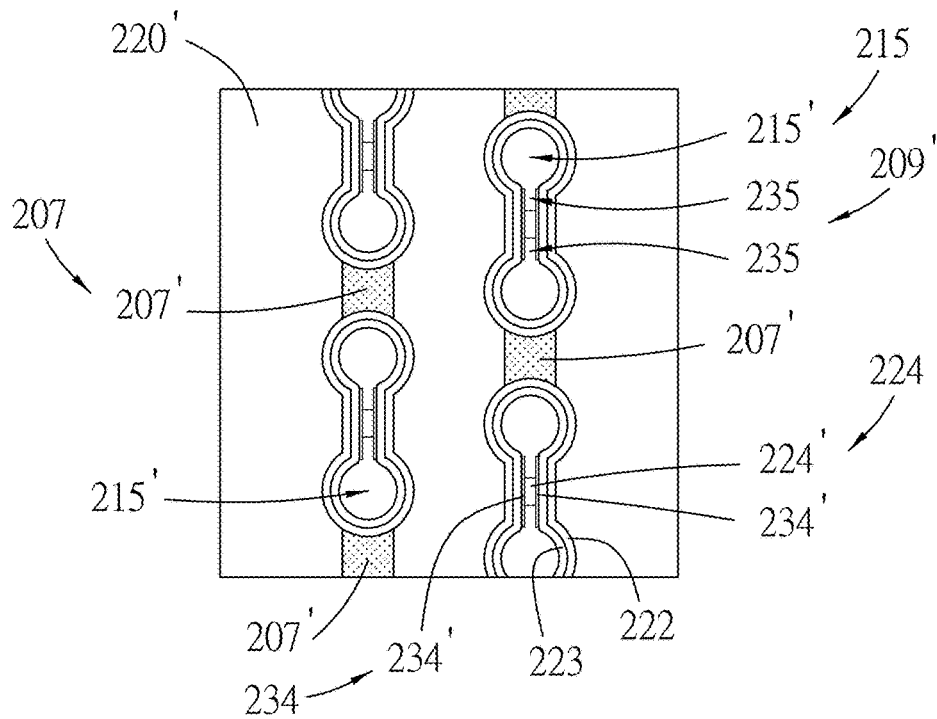

Referring to FIG. 85, after performing the step to obtain the structure as shown in FIG. 84, the separation segments 224' of the separation feature 224 are etched (also known as pull back) such that two side portions 235 of each of the channel trenches 209' are exposed. The etching step may be conducted using a suitable technique, such as wet etching, dry etching (e.g., atomic layer etching or the like), a combination thereof, or the like. In some embodiments, the capping segments 234' of the capping layer 234 and the separation segments 224' of the separation feature 224 are made of different materials that have distinct etch rate relative to each other. Therefore, when the separation segments 224' of the separation feature 224 are being etched, the capping segments 234' of the capping layer 234 are substantially unetched or only slightly etched, as shown in FIG. 85.

Figure 86:
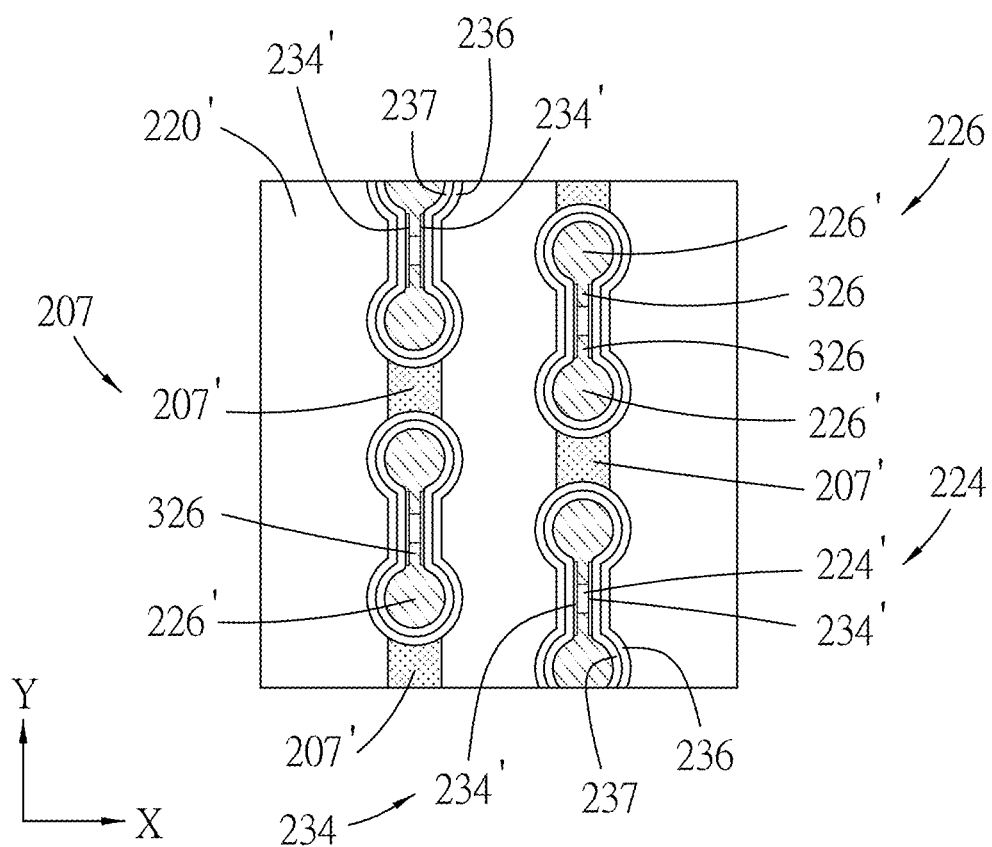

Referring to FIG. 86, after performing the step to obtain the structure as shown in FIG. 85, the step of block 132 of FIG. 1 may be conducted to form the conductive feature 226 including a plurality of the conductive segments 226' which fill the source/drain trenches 215' and the side portions 235 of the channel trenches 209' (see FIG. 85). In some embodiments, each of the conductive segments 226' filling a respective one of the source/drain trenches 215' has an extension portion 326 that fills a corresponding one of the side portions 235 of a corresponding one of the channel trenches 209'. In some embodiments, each of the separation segments 224' has a width in the X direction ranging from about 10 nm to about 100 nm, but other range values are also within the scope of this disclosure.

Figure 87:
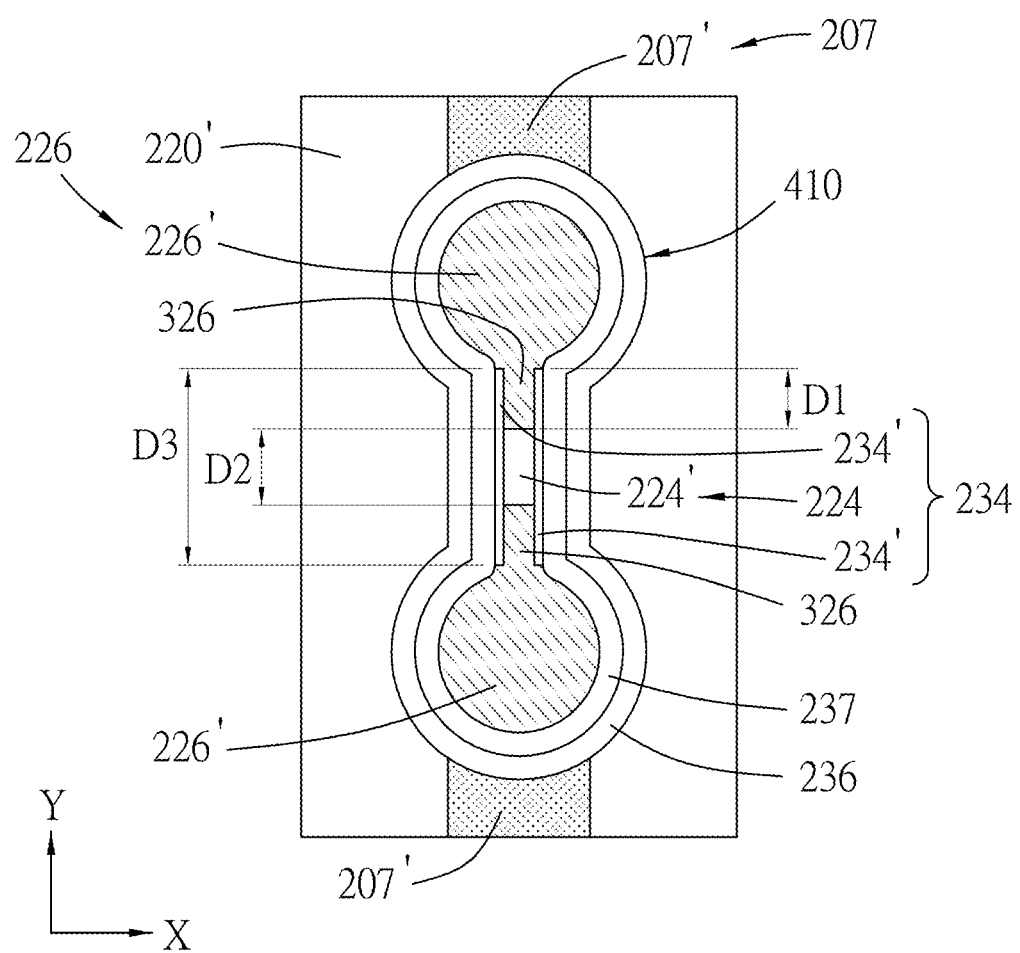
FIG. 87 is an enlarged schematic view of a memory cell structure of the semiconductor memory device shown in FIG. 86 in accordance with some embodiments.

FIG. 87 is an enlarged schematic sectional view of one of the memory cell structures 410 shown in FIG. 86. The memory cell structure 410 in FIG. 87 includes one of the memory segments 236, one of the channel segments 237, two of the conductive segments 226' each including the extension portion 326, two of the capping segments 234', and one of the separation segments 224'. Each of the extension portions 326 may have a length (D1) in the Y direction (which corresponds to a length of a corresponding one of the side portions 235 shown in FIG. 85), the separation segment 224' may have a length (D2) in the Y direction, and a corresponding channel trench 209' (see FIG. 48) may have a length (D3) of in the Y direction (denoted in FIG. 87). In some embodiments, the combined lengths (D1) of the extension portions 326 may account for about 0% (i.e., there are no extension portions 326) to about 80% of the length (D3) (i.e., the total of the lengths (D1) of the extension portions 326 and the length (D2) of the separation segment 224'), but other range values are also within the scope of this disclosure. If such percentage exceeds 80%, the separation segment 224' may not be able to isolate the extension portions 326. Operation of the memory cell structures 410 may be controlled by one of the conductive layer 220' shown in FIG. 87. In some embodiments, electrons may be injected into one of the conductive segments 226', and then the electrons flow through the channel segment 237 to the other one of the conductive segments 226'. The memory segment 236, serving as charge trapping layer or a floating layer, is adapted for storing electrons coming from the channel segment 237, or the memory segment 236, serving as a ferroelectric layer, is adapted for changing property (e.g., electric polarization, etc.) according to the flow of the electrons. In some embodiments, the extension portions 326 of the conductive segments 226' may increase the amount of electrons being injected, and may increase electric field applied to the memory cell structures 410, thereby improving program and erase efficiencies of the memory cell structures 410. In some embodiments, with the capping segments 234' electrically insulating the extension portions 326 of the conductive segments 226' from the channel segment 237, the channel of the memory cell structures 410 may have the length (D3), which is greater than the length (D2) when the capping segments 234' are omitted, thereby avoiding short channel effect.

In some embodiments, in a method of making a semiconductor memory device, a memory layer, a channel layer and a separation feature may be formed in a trench before the formation of multiple source/drain trenches. Some of the source/drain trenches may be misaligned and may damage the channel layer or even the memory layer due to various factors, such as overlay issue during photolithography process. On the other hand, the processes described in FIGS. 1 and 69 to obtain the structures shown in FIGS. 2 to 68 and those shown in FIGS. 70 to 87, which involve forming the source/drain trenches 215' and the channel trenches 209' followed by forming the memory layer 222 and the channel layer 223, may eliminate the abovementioned overlay issue.

In accordance with some embodiments, a semiconductor memory device includes a substrate, a stack structure, a plurality of dielectric isolation segments and a plurality of memory cell structures. The stack structure is disposed on the substrate, and includes a plurality of dielectric layers and a plurality of conductive layers alternatingly stacked in a Z direction substantially perpendicular to the substrate. The dielectric isolation segments extend through the stack structure. The memory cell structures are disposed in the stack structure, and are separated from one another by the dielectric isolation segments. Each of the memory cell structures includes a pair of conductive segments each penetrating the stack structure in the Z direction, a dielectric separation segment separating the conductive segments, a conductive channel segment enclosing side surfaces of the conductive segments and the dielectric separation segment, and a memory segment enclosing side surface of the conductive channel segment and being connected between the stack structure and the conductive channel segment.

In accordance with some embodiments, for each of the memory cell structures, each of the conductive channel segment and the memory segment has a thickness ranging from about 3 nm to about 100 nm.

In accordance with some embodiments, for each of the memory cell structures, the memory segment is a floating layer, an oxide-nitride-oxide trilayer or a ferroelectric layer.

In accordance with some embodiments, the semiconductor memory device further includes at least one dielectric refill segment that penetrates the stack structure and one of the dielectric isolation segments in the Z direction. A maximum width of the at least one dielectric refill segment in the X direction is greater than a maximum width of the one of the dielectric isolation segments in the X direction.

In accordance with some embodiments, the memory cell structures are arranged into two groups that are separated in an X direction substantially parallel to the substrate. For each group, the memory cell structures are substantially aligned in a Y direction substantially parallel to the substrate and substantially perpendicular to the X direction. Each of the memory cell structures in one group is misaligned with a corresponding one of the memory cell structures in the other group in the X direction.

In accordance with some embodiments, the conductive segments of each of the memory cell structures are separated in the Y direction and are substantially aligned in the Y direction. For each of the memory cell structure, a maximum width of each of the conductive segments in the X direction is greater than a maximum width of the dielectric separation segment in the X direction.

In accordance with some embodiments, for each of the memory cell structures, the maximum width of each of the conductive segments is at least 10 nm greater than the maximum width of the dielectric separation segment.

In accordance with some embodiments, each of the memory cell structures further includes two dielectric capping segments. For each of the memory cell structures, the dielectric capping segments are respectively connected to opposite sides of the dielectric separation segment in the X direction, and each of the dielectric capping segments being connected between the dielectric separation segment and the conductive channel segment.

In accordance with some embodiments, for each of the memory cell structures, each of the conductive segments includes an extension portion that extends between the dielectric capping segments and that is connected to the dielectric separation segment.

In accordance with some embodiments, for each of the memory cell structures, the extension portion of each of the conductive segments has a length (D1) in the Y direction, the dielectric separation segment has a length (D2) in the Y direction, and 2×D1/D2 is not greater than about 0.8.

In accordance with some embodiments, a method for manufacturing a semiconductor memory device includes: forming a stack structure on a substrate, the stack structure including a plurality of dielectric layers and a plurality of sacrificial layers alternatingly stacked in a Z direction substantially perpendicular to the substrate; forming a plurality of first isolation trenches each penetrating the stack structure in the Z direction, and at least one second isolation trench penetrating the stack structure in the Z direction, the first isolation trenches and the at least one second isolation trench being substantially aligned in a Y direction substantially parallel to the substrate, the at least one second isolation trench having a length in the Y direction greater than a length of each of the first isolation trenches in the Y direction; forming a plurality of dielectric isolation segments respectively filling the first isolation trenches and the at least one second isolation trench; forming a plurality of channel trenches, each of the channel trenches penetrating the stack structure in the Z direction and being disposed between corresponding adjacent two of the dielectric isolation segments; forming a plurality of first sacrificial segments respectively filling the channel trenches; forming a plurality of source/drain trenches each extending in the Z direction and penetrating the stack structure, a corresponding one of the dielectric isolation segments and a corresponding one of the first sacrificial segments, the source/drain trenches, the dielectric isolation segments and the first sacrificial segments being substantially aligned in the Y direction; forming a plurality of second sacrificial segments respectively filling the source/drain trenches; forming at least one through hole extending in the Z direction and penetrating the stack structure and a corresponding one of the dielectric isolation segments; removing the sacrificial layers to form a plurality of spaces, the dielectric layers and the spaces being alternatingly disposed in the Z direction, the spaces being spatially communicated with the at least one through hole; forming a plurality of conductive layers respectively filling the spaces; forming at least one refill segment filling the at least one through hole; removing the first sacrificial segments and the second sacrificial segments; forming a memory layer in the channel trenches and the source/drain trenches; forming a conductive channel layer on the memory layer; forming a dielectric separation feature completely filling the channel trenches and partially filling the source/drain trenches; removing the dielectric separation feature in the source/drain trenches to respectively form a plurality of dielectric separation segments in the channel trenches; and forming a conductive feature filling the source/drain trenches.

In accordance with some embodiments, the method further includes: before forming the dielectric separation feature, forming a dielectric capping layer on the conductive channel layer and in the source/drain trenches and the channel trenches; after removing the dielectric separation feature, removing the dielectric capping layer in the source/drain trenches while maintaining the dielectric capping layer in the channel trenches; after removing the dielectric capping layer, removing a portion of each of the dielectric separation segments such that two side portions of each of the channel trenches are exposed; and forming the conductive feature to further fill the side portions of each of the channel trenches with the conductive feature.

In accordance with some embodiments, in the method of manufacturing the semiconductor memory device, each of the side portions of each of the channel trenches has a length (D1) in the Y direction. After removing a portion of each of the dielectric separation segments, each of the dielectric separation segments has a length (D2) in the Y direction, and 2×D1/D2 is not greater than about 0.8.

In accordance with some embodiments, in the method of manufacturing the semiconductor memory device, forming the conductive layers includes: forming a conductive portion covering the top surface of the stack structure and an inner wall which defines the at least one through hole; and removing the conductive portion while retaining the conductive layers.

In accordance with some embodiments, in the method of manufacturing the semiconductor memory device, removing the conductive portion includes partially etching the conductive layers exposed from the at least one through hole.

In accordance with some embodiments, a method for manufacturing a semiconductor memory device includes: forming a stack structure on a substrate, the stack structure including a plurality of dielectric layers and a plurality of sacrificial layers alternatingly stacked in a Z direction substantially perpendicular to the substrate; forming a plurality of first isolation trenches each penetrating the stack structure in the Z direction, and at least one second isolation trench penetrating the stack structure in the Z direction, the first isolation trenches and the at least one second isolation trench being substantially aligned in a Y direction substantially parallel to the substrate, the at least one second isolation trench having a length in the Y direction greater than a length of each of the first isolation trenches in the Y direction; forming a plurality of dielectric isolation segments respectively filling the first isolation trenches and the at least one second isolation trench; forming a plurality of source/drain trenches each extending in the Z direction, and each penetrating the stack structure and a corresponding one of the dielectric isolation segments, the source/drain trenches and the dielectric isolation segments being substantially aligned in the Y direction; forming a plurality of second sacrificial segments respectively filling the source/drain trenches; forming a plurality of channel trenches each extending in the Z direction, and each penetrating the stack structure and corresponding two of the second sacrificial segments; forming a plurality of first sacrificial segments respectively filling the channel trenches; forming at least one through hole extending in the Z direction and penetrating the stack structure and the at least one second isolation trench; removing the sacrificial layers to form a plurality of spaces, the dielectric layers and the spaces being alternatingly disposed in the Z direction, the spaces being spatially communicated with the at least one through hole; forming a plurality of conductive layers respectively filling the spaces; forming at least one refill segment filling the at least one through hole; removing the first sacrificial segments and the second sacrificial segments; forming a memory layer in the channel trenches and the source/drain trenches; forming a conductive channel layer on the memory layer; forming a dielectric separation feature completely filling the channel trenches and partially filling the source/drain trenches; removing the dielectric separation feature in the source/drain trenches to respectively form a plurality of dielectric separation segments in the channel trenches; and forming a conductive feature filling the source/drain trenches.

In accordance with some embodiments, the method of manufacturing the semiconductor memory device further includes: before forming the dielectric separation feature, forming a dielectric capping layer on the conductive channel layer and in the source/drain trenches and the channel trenches; after removing the dielectric separation feature, removing the dielectric capping layer in the source/drain trenches while maintaining the dielectric capping layer in the channel trenches; after removing the dielectric capping layer, removing a portion of each of the dielectric separation segments such that two side portions of each of the channel trenches are exposed; and forming the conductive feature to further fill the side portions of each of the channel trenches with the conductive feature.

In accordance with some embodiments, in the method of manufacturing the semiconductor memory device, each of the side portions of each of the channel trenches has a length (D1) in the Y direction. After removing a portion of each of the dielectric separation segments, each of the dielectric separation segments has a length (D2) in the Y direction, and 2×D1/D2 is not greater than about 0.8.

In accordance with some embodiments, in the method of manufacturing the semiconductor memory device, forming the conductive layers includes: forming a conductive portion covering the top surface of the stack structure and an inner wall which defines the at least one through hole; and removing the conductive portion while retaining the conductive layers.

In accordance with some embodiments, in the method of manufacturing the semiconductor memory device, removing the conductive portion includes partially etching the conductive layers exposed from the at least one through hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor memory device, comprising:
   forming a stack structure on a substrate, the stack structure including a plurality of dielectric layers and a plurality of sacrificial layers alternatingly stacked in a Z direction perpendicular to the substrate;
   forming a plurality of first isolation trenches each penetrating the stack structure in the Z direction, and at least one second isolation trench penetrating the stack structure in the Z direction, the plurality of first isolation trenches and the at least one second isolation trench being aligned in a Y direction parallel to the substrate, the at least one second isolation trench having a length in the Y direction greater than a length of each of the plurality of first isolation trenches in the Y direction;
   forming a plurality of dielectric isolation segments respectively filling the plurality of first isolation trenches and the at least one second isolation trench;
   forming a plurality of channel trenches, each of the plurality of channel trenches penetrating the stack structure in the Z direction and being disposed between two adjacent ones of the plurality of dielectric isolation segments;
   forming a plurality of first sacrificial segments respectively filling the plurality of channel trenches;
   forming a plurality of source/drain trenches each extending in the Z direction and penetrating the stack structure, a corresponding one of the plurality of dielectric isolation segments and a corresponding one of the plurality of first sacrificial segments, the plurality of source/drain trenches, the plurality of dielectric isolation segments and the plurality of first sacrificial segments being aligned in the Y direction;
   forming a plurality of second sacrificial segments respectively filling the plurality of source/drain trenches;
   forming at least one through hole extending in the Z direction and penetrating the stack structure and an immediately adjacent one of the plurality of dielectric isolation segments;
   removing the plurality of sacrificial layers to form a plurality of spaces, the plurality of dielectric layers and the plurality of spaces being alternatingly disposed in the Z direction, the plurality of spaces being spatially communicated with the at least one through hole;
   forming a plurality of conductive layers respectively filling the plurality of spaces;
   forming at least one refill segment filling the at least one through hole;
   removing the plurality of first sacrificial segments and the plurality of second sacrificial segments;
   forming a memory layer in the plurality of channel trenches and the plurality of source/drain trenches;
   forming a conductive channel layer on the memory layer;
   forming a dielectric separation feature completely filling the plurality of channel trenches and partially filling the plurality of source/drain trenches;
   removing the dielectric separation feature in the plurality of source/drain trenches to respectively form a plurality of dielectric separation segments in the plurality of channel trenches; and
   forming a conductive feature filling the plurality of source/drain trenches.

2. The method as claimed in claim 1, further comprising:
before forming the dielectric separation feature, forming a dielectric capping layer on the conductive channel layer and in the plurality of source/drain trenches and the plurality of channel trenches;
after removing the dielectric separation feature, removing the dielectric capping layer in the plurality of source/drain trenches while maintaining the dielectric capping layer in the plurality of channel trenches;
after removing the dielectric capping layer, removing a portion of each of the plurality of dielectric separation segments such that two side portions of each of the plurality of channel trenches are exposed; and
forming the conductive feature to further fill the two side portions of each of the plurality of channel trenches with the conductive feature.

3. The method as claimed in claim 2, wherein:
each of the two side portions of each of the plurality of channel trenches has a length (D1) in the Y direction;
after removing the portion of each of the plurality of dielectric separation segments, each of the plurality of dielectric separation segments has a length (D2) in the Y direction; and
wherein 2×D1/D2 is not greater than 0.8.

4. The method as claimed in claim 1, wherein forming the plurality of conductive layers includes:
forming a conductive portion covering the top surface of the stack structure and an inner wall which defines the at least one through hole; and
removing the conductive portion while retaining the plurality of conductive layers.

5. The method as claimed in claim 4, wherein removing the conductive portion includes partially etching the plurality of conductive layers exposed from the at least one through hole.

6. The method as claimed in claim 1, wherein each of the plurality of source/drain trenches is formed between the corresponding one of the plurality of dielectric isolation segments and the corresponding one of the plurality of first sacrificial segments in the Y direction.

7. The method as claimed in claim 1, wherein the at least one through hole is formed to have a maximum width greater than a width of the corresponding one of the plurality of dielectric isolation segments in an X direction parallel to the substrate and perpendicular to the Y direction.

8. A method for manufacturing a semiconductor memory device, comprising:
forming a stack structure on a substrate, the stack structure including a plurality of dielectric layers and a plurality of sacrificial layers alternatingly stacked in a Z direction perpendicular to the substrate;
forming a plurality of first isolation trenches each penetrating the stack structure in the Z direction, and at least one second isolation trench penetrating the stack structure in the Z direction, the plurality of first isolation trenches and the at least one second isolation trench being aligned in a Y direction parallel to the substrate, the at least one second isolation trench having a length in the Y direction greater than a length of each of the plurality of first isolation trenches in the Y direction;
forming a plurality of dielectric isolation segments respectively filling the plurality of first isolation trenches and the at least one second isolation trench;
forming a plurality of channel trenches, each of the plurality of channel trenches penetrating the stack structure in the Z direction;
forming a plurality of source/drain trenches each extending in the Z direction and penetrating the stack structure and a corresponding one of the plurality of dielectric isolation segments, the plurality of source/drain trenches and the plurality of dielectric isolation segments being aligned in the Y direction;
forming a plurality of first sacrificial segments respectively filling the plurality of channel trenches;
forming a plurality of second sacrificial segments respectively filling the plurality of source/drain trenches;
forming at least one through hole extending in the Z direction and penetrating the stack structure;
removing the plurality of sacrificial layers to form a plurality of spaces, the plurality of dielectric layers and the plurality of spaces being alternatingly disposed in the Z direction, the plurality of spaces being spatially communicated with the at least one through hole;
forming a plurality of conductive layers respectively filling the plurality of spaces;
forming at least one refill segment filling the at least one through hole;
removing the plurality of first sacrificial segments and the plurality of second sacrificial segments;
forming a memory layer in the plurality of channel trenches and the plurality of source/drain trenches;
forming a conductive channel layer on the memory layer;
forming a dielectric separation feature completely filling the plurality of channel trenches and partially filling the plurality of source/drain trenches;
removing the dielectric separation feature in the plurality of source/drain trenches to respectively form a plurality of dielectric separation segments in the plurality of channel trenches; and
forming a conductive feature filling the plurality of source/drain trenches.

9. The method as claimed in claim 8, wherein the plurality of channel trenches are formed in a manner that each of the plurality of channel trenches is disposed between two adjacent ones of the plurality of dielectric isolation segments.

10. The method as claimed in claim 8, wherein the plurality of source/drain trenches are formed in a manner that each of the plurality of source/drain trenches further penetrates a corresponding one of the plurality of first sacrificial segments, and that the plurality of source/drain trenches, the plurality of dielectric isolation segments and the plurality of first sacrificial segments are aligned in the Y direction.

11. The method as claimed in claim 8, wherein the at least one through hole is formed in a manner that the at least one through hole further penetrates an immediately adjacent one of the plurality of dielectric isolation segments.

12. The method as claimed in claim 8, wherein formation of the conductive feature includes:
forming a conductive material on the conductive channel layer and in the plurality of source/drain trenches, and
removing a portion of the conductive material, a portion of the conductive channel layer and a portion of the memory layer until the top surface of the stack structure is exposed, so as to form the conductive feature that includes a plurality of conductive segments, a plurality of channel segments, and a plurality of memory segments.

13. The method as claimed in claim 12, wherein the plurality of conductive segments are formed to respectively fill the plurality of source/drain trenches and to be electrically connected to the plurality of conductive layers.

14. The method as claimed in claim 12, wherein each of the plurality of channel segments is formed to be connected to a respective one of the plurality of dielectric separation segments and corresponding two of the plurality of conductive segments.

15. The method as claimed in claim 12, wherein each of the plurality of memory segments is formed to be connected between a respective one of the plurality of channel segments and the stack structure.

16. A method for manufacturing a semiconductor memory device, comprising:

forming a stack structure on a substrate, the stack structure including a plurality of dielectric layers and a plurality of sacrificial layers alternatingly stacked in a Z direction perpendicular to the substrate;

forming a plurality of isolation trenches arranged into a first group and a second group which are separated in an X direction parallel to the substrate, each of the first group and the second group of the plurality of isolation trenches including a plurality of first isolation trenches each penetrating the stack structure in the Z direction, and at least one second isolation trench penetrating the stack structure in the Z direction, the plurality of first isolation trenches and the at least one second isolation trench in each of the first group and the second group being aligned in a Y direction parallel to the substrate and perpendicular to the X direction, the at least one second isolation trench in each of the first group and the second group having a length in the Y direction greater than a length of each of the plurality of first isolation trenches in each of the first group and the second group in the Y direction;

forming a plurality of dielectric isolation segments respectively filling the plurality of first isolation trenches and the at least one second isolation trench in each of the first group and the second group;

forming a plurality of channel trenches, each of the plurality of channel trenches penetrating the stack structure in the Z direction;

forming a plurality of source/drain trenches each extending in the Z direction and penetrating the stack structure and a corresponding one of the plurality of dielectric isolation segments, the plurality of source/drain trenches and the plurality of dielectric isolation segments being aligned in the Y direction;

forming a plurality of first sacrificial segments respectively filling the plurality of channel trenches;

forming a plurality of second sacrificial segments respectively filling the plurality of source/drain trenches;

forming at least one through hole extending in the Z direction and penetrating the stack structure;

removing the plurality of sacrificial layers to form a plurality of spaces, the plurality of dielectric layers and the plurality of spaces being alternatingly disposed in the Z direction, the plurality of spaces being spatially communicated with the at least one through hole;

forming a plurality of conductive layers respectively filling the plurality of spaces;

forming at least one refill segment filling the at least one through hole;

removing the plurality of first sacrificial segments and the plurality of second sacrificial segments;

forming a memory layer in the plurality of channel trenches and the plurality of source/drain trenches;

forming a conductive channel layer on the memory layer;

forming a dielectric separation feature completely filling the plurality of channel trenches and partially filling the plurality of source/drain trenches;

removing the dielectric separation feature in the plurality of source/drain trenches to respectively form a plurality of dielectric separation segments in the plurality of channel trenches; and forming a conductive feature filling the plurality of source/drain trenches.

17. The method as claimed in claim 16, wherein the plurality of channel trenches are formed to be arranged into a first group and a second group separated in the X direction, each of the plurality of channel trenches in the first group being misaligned with a corresponding one of the plurality of channel trenches in the second group in the X direction.

18. The method as claimed in claim 16, wherein the plurality of source/drain trenches are formed to be arranged into a first group and a second group separated in the X direction, each of the plurality of source/drain trenches in the first group being misaligned with a corresponding one of the plurality of source/drain trenches in the second group in the X direction.

19. The method as claimed in claim 16, wherein the plurality of dielectric isolation segments are formed to be arranged into a first group and a second group separated in the X direction, each of the plurality of dielectric isolation segments in the first group being misaligned with a corresponding one of the plurality of dielectric isolation segments in the second group in the X direction.

20. The method as claimed in claim 16, wherein the conductive feature is formed with a plurality of conductive segments that are formed to respectively fill the plurality of source/drain trenches and to be electrically connected to the plurality of conductive layers, the method further comprising, after formation of the conductive feature, forming a plurality of connection wires to be respectively and electrically connected to the plurality of conductive segments of the conductive feature.

* * * * *